(12) United States Patent
Chen et al.

(10) Patent No.: US 12,074,024 B2
(45) Date of Patent: Aug. 27, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Chung-Lei Chen, Hsinchu (TW); Anhao Cheng, Taichung (TW); Meng-I Kang, Changhua County (TW); Yen-Liang Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/752,473

(22) Filed: May 24, 2022

(65) Prior Publication Data

US 2023/0207313 A1      Jun. 29, 2023

Related U.S. Application Data

(60) Provisional application No. 63/294,507, filed on Dec. 29, 2021.

(51) Int. Cl.
*H01L 21/02* (2006.01)
(52) U.S. Cl.
CPC .. *H01L 21/02532* (2013.01); *H01L 21/02554* (2013.01)
(58) Field of Classification Search
CPC ......... H01L 21/02532; H01L 21/02554; H01L 29/00; H01L 21/76; H01L 21/7624; H01L 29/66575; H01L 29/78654; H01L 29/0649; H01L 29/0653; H01L 29/78
See application file for complete search history.

(56) References Cited

U.S. PATENT DOCUMENTS

| 2005/0202600 | A1* | 9/2005 | Yamashita | H01L 21/7624 438/149 |
| 2008/0135924 | A1* | 6/2008 | Lebby | H01L 29/78654 257/E21.409 |
| 2008/0283918 | A1* | 11/2008 | Cheng | H01L 29/6659 257/E21.337 |
| 2009/0001468 | A1* | 1/2009 | Shin | H01L 29/6653 257/E29.085 |

(Continued)

FOREIGN PATENT DOCUMENTS

| TW | 200620537 A | 6/2006 |
| TW | 200625635 A | 7/2006 |

OTHER PUBLICATIONS

Office Action issued in connection with Taiwan Appl. No. 111127330 dated Aug. 23, 2023.

*Primary Examiner* — Farun Lu
*Assistant Examiner* — Sandra Milena Rodriguez Villan
(74) *Attorney, Agent, or Firm* — FOLEY & LARDNER LLP

(57) ABSTRACT

A semiconductor device includes a first silicon layer. The semiconductor device includes a plurality of first buried oxide layers embedded in the first silicon layer. The semiconductor device includes a second silicon layer disposed over the plurality of first buried oxide layers. Vertical distances between the plurality of first buried oxide layers and the second silicon layer, respectively, are different.

20 Claims, 31 Drawing Sheets

(56) References Cited

U.S. PATENT DOCUMENTS

2012/0168863 A1* 7/2012 Zhu ................... H01L 27/1203
                                                    257/E21.409
2014/0225160 A1* 8/2014 Clifton .............. H01L 21/02532
                                                    257/190

* cited by examiner

SEMICONDUCTOR DEVICES AND METHODS OF MANUFACTURING THEREOF

CROSS-REFERENCE TO RELATED APPLICATION

This application claims priority to and the benefit of U.S. Provisional Application No. 63/294,507, filed Dec. 29, 2021, entitled "MULTI-LAYER BURIED OXIDE (BOX) STRUCTURE FOR DEVICE LEAKAGE REDUCTION," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
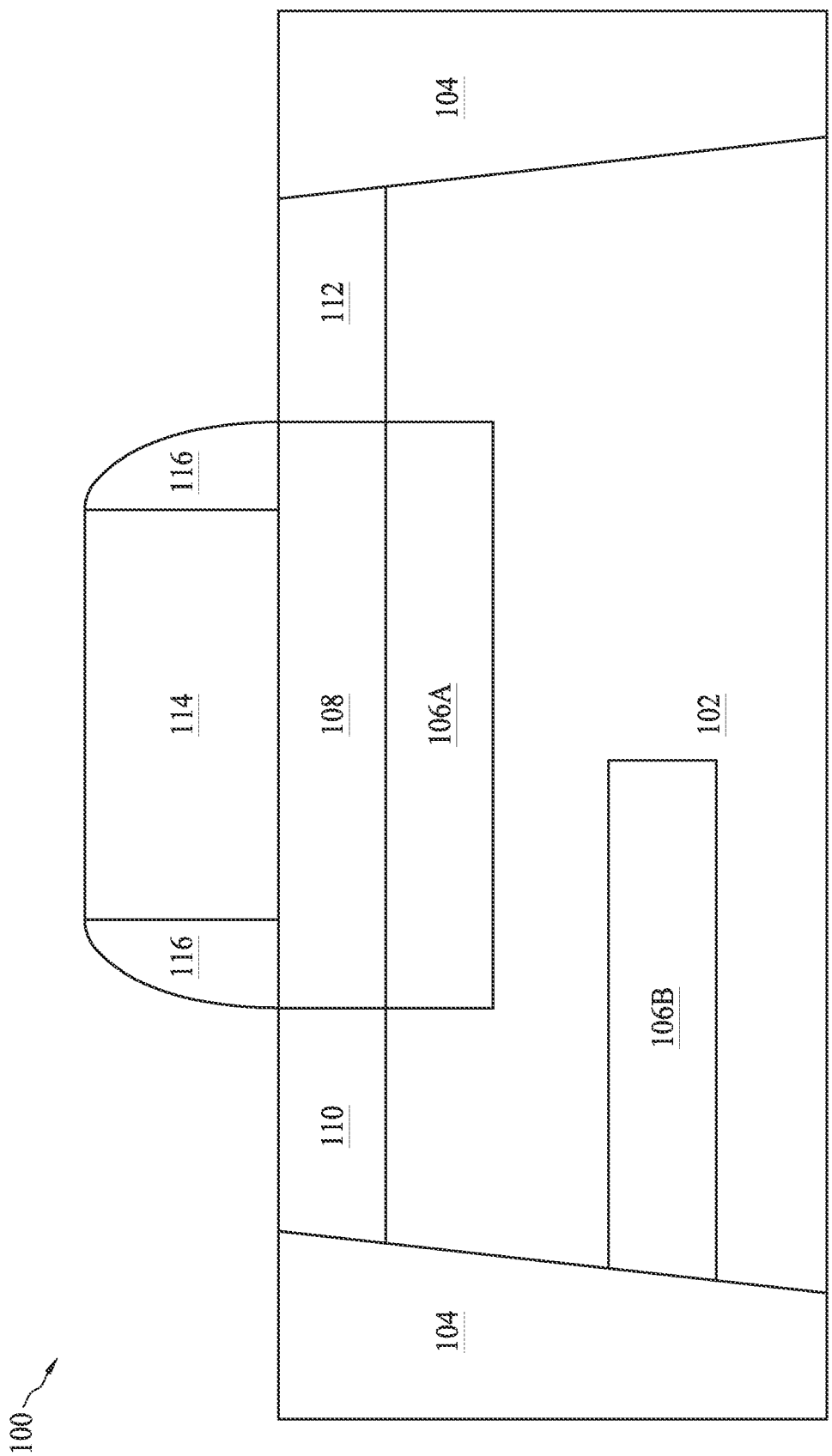
FIG. 1 illustrates a cross-sectional view of an SOI device including a number of BOX'es, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One of the goals of the semiconductor industry is to continue shrinking the size and increasing the speed of individual transistors. Silicon on insulator (SOI) devices (or SOI transistors) have been recognized as one of the possible solutions to enable continued scaling. SOI devices offer a number of advantages over bulk devices. In particular, SOI devices exhibit very low junction capacitance compared to bulk devices. The source and drain junction capacitances are almost entirely eliminated. As the buried oxide in an SOI device is typically quite thick, the capacitance increase from the buried oxide is minimal. Further, SOI devices do not have body contact. Hence, unlike bulk devices, there is no body effect. The threshold voltage of stacked SOI devices is not degraded by the body effect since the body potential is not tied to a ground potential or a drain potential (Vdd) (since the body potential can rise to the same potential as the source). Unlike bulk devices, SOI devices have better soft error immunity. SOI devices improve soft error rate because the buried oxide blocks ionizing radiation from entering the transistor channel.

In general, an SOI device is formed on an SOI substrate, which includes an underlying (lower) silicon layer, a buried oxide (BOX) over the underlying silicon layer, and an overlaying (upper) silicon layer over the BOX. The SOI device typically has its active components (e.g., a channel, a source, a drain) formed in the overlaying silicon layer. Accordingly, a quality of this overlaying silicon layer is generally desired to be as high as possible. In existing technologies, to fabricate an SOI device, such an SOI substrate is purchased as it is. Alternatively stated, the quality of its overlaying silicon layer cannot be controlled, or a corresponding cost to meet a certain quality can be significantly high.

The SOI device roughly has two main categories, a fully depleted SOI device and a partially depleted SOI device. Depending on a thickness of the upper silicon layer above the BOX, the corresponding SOI device will operate in fully depleted or partially depleted regimes. Partially depleted SOI devices are built on relatively thick silicon layers with the gate depletion depths of transistor channel shallower than the thickness of the upper silicon layer. In contrast, when the gate depletion depth extends beyond the thickness of the upper silicon layer, the SOI device operates in a fully depleted mode. Hence, in a fully depleted SOI device, the upper silicon layer has a thickness that is less than the maximum gate depletion depth in the silicon during device operation. Consequently, the upper silicon layer of the fully depleted SOI device is fully depleted before the threshold voltage is reached.

Typically, an existing SOI substrate has its upper silicon layer fully overlay its BOX, which may somehow limit the scope of possible applications. For example, the fully depleted SOI devices and partially depleted SOI devices have their own applications, respectively. The partially depleted SOI devices are widely leveraged in high-performance processors, embedded electronic devices, analog devices, RF devices, etc., while the fully depleted SOI devices can be used in some low-power or even ultra-low-power applications. Accordingly, when multiple applications are to be integrated, multiple SOI substrates are generally required, which can further increase the cost of manufacturing. Thus, the existing SOI devices have not been entirely satisfactory in many aspects.

The present disclosure provides various embodiments of an SOI transistor structure (e.g., including a number of SOI transistors) immune from the above-identified issues, and methods for forming the same. For example, the SOI transistor structure, as disclosed herein, can be formed on a bulk silicon substrate, with one or more BOX'es formed in the bulk silicon substrate. In various embodiments, such a BOX is formed through doping a region of the bulk silicon substrate with a certain conductive type of dopants (e.g., n-type). One or more overlaying silicon layers, with respectively desired thickness, can be epitaxially grown over the bulk silicon substrate. Next, the doped portion of the silicon substrate can be replaced with a dielectric material (e.g., an oxide material), thereby forming the BOX, together with an isolation structure (e.g., a shallow trench isolation (STI)). Further, by controlling doped portions in respectively different regions (e.g., different depths) within the silicon substrate, multiple BOX'es in different regions can be formed, which can in turn provide various advantages over the conventional techniques of forming SOI devices. For example, with the disclosed technique, multiple BOX'es can be formed in a single bulk silicon substrate with different depths, which allows various types of SOI transistors (e.g., a fully depleted SOI transistor and a partially depleted SOI transistor) to be formed thereon. In another example, with such multiple BOX'es formed in different depths and connected to each other, the silicon substrate (in turn the completed SOI transistor structure) can advantageously tolerate more mechanical stress.

Figure 2:
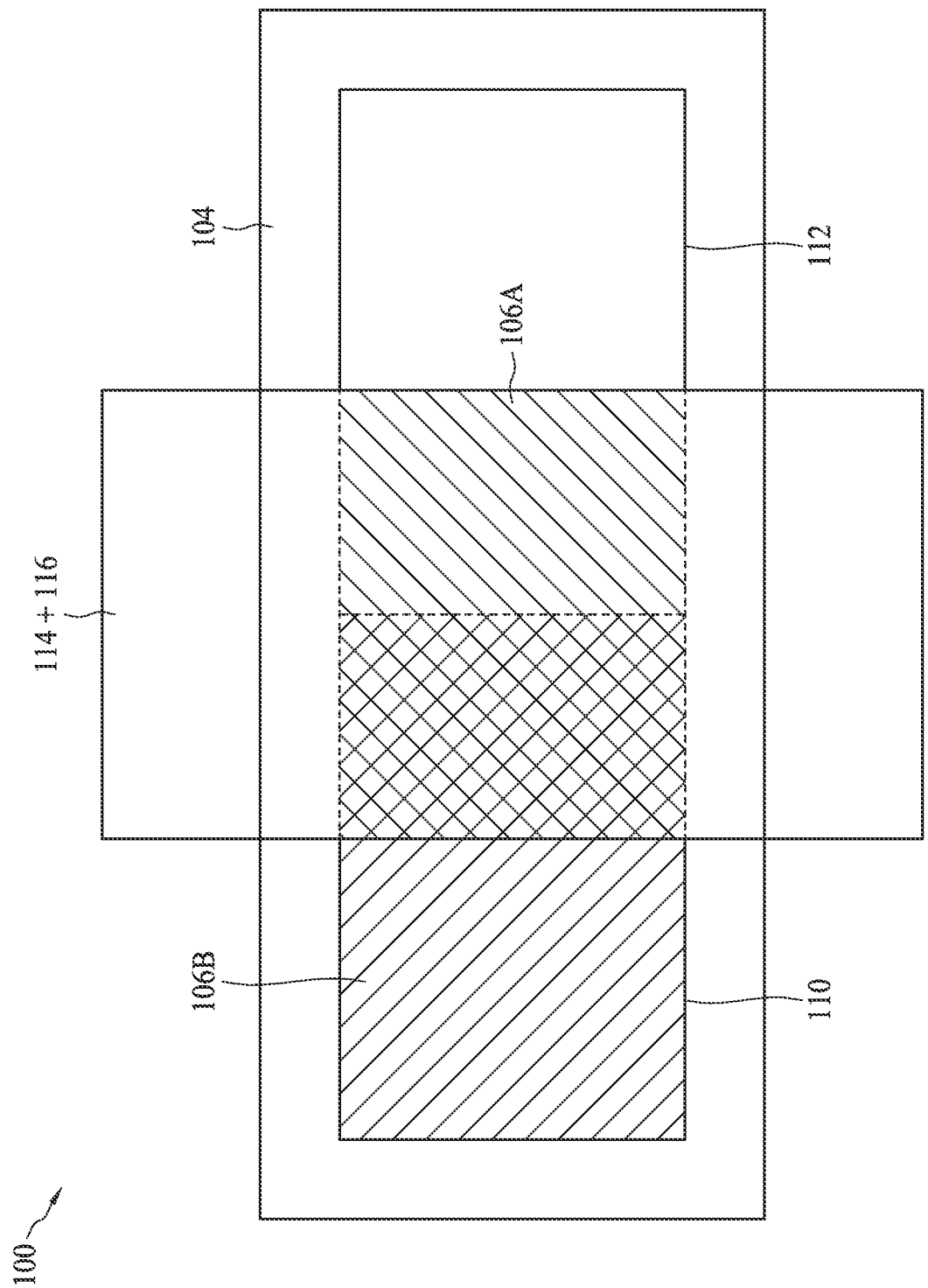
FIG. 2 illustrates a corresponding top view of the SOI device of FIG. 1, in accordance with some embodiments.

FIG. 1 illustrates a cross-sectional view of an example SOI device 100 including a number of BOX'es formed by the disclosed method, and FIG. 2 illustrate a corresponding top view of the SOI device 100, in accordance with various embodiments. The SOI device 100 of FIGS. 1-2 is merely provided for illustrative purposes, and is not intended to limit the scope of present disclosure. For example, although the SOI device 100 includes two BOX'es, it should be understood that an SOI device, formed by the disclosed method, can include any number of BOX'es while remaining within the scope of present disclosure. Further, although the SOI device 100 is illustrated as a fully depleted SOI device, it should be appreciated that the disclosed method is not limited to fabricating fully depleted SOI devices.

As shown, the SOI device 100 includes a lower silicon layer 102, an isolation structure 104, a number of BOX'es, 106A and 106B, an upper silicon layer 108, source/drain structures (or regions), 110 and 112, a gate structure 114, and gate spacers 116. The isolation structure 104 can enclose an active region of the lower silicon layer 102 for forming various device features (e.g., BOX'es 106A-B, 108, source/drain structures 110-112, gate structure 114, and gate spacers 116) of the SOI device 100, which will be better appreciated in the top view of the SOI device 100 shown in FIG. 2. In various embodiments, the lower silicon layer 102 may be formed (e.g., provided) as a substrate, and the upper silicon layer 108 may be later formed over the lower silicon layer 102 through an epitaxial growth process, which will be described in further detail below.

Within the lower silicon layer 102, the BOX'es 106A and 106B are formed in respectively different locations. For example in FIG. 1, the BOX 106A is disposed immediately next to the upper silicon layer 108, with no portion of the upper silicon layer 108 in contact with the lower silicon layer 102, which allows the SOI device 100 to operate in a fully depleted regime. On the other hand, the BOX 106B is disposed below and spaced from the upper silicon layer 108, with a vertical distance. Alternatively stated, the BOX'es 106A and 106B are vertically spaced from the upper silicon layer 108 with respectively different vertical distances. Such BOX'es 106A and 106B may be laterally offset from each other with a desired lateral distance, as shown. Further in FIG. 1, the BOX'es 106A and 106B are vertically spaced from each other. In some other embodiments, however, these two BOX'es 106A and 106B, being laterally offset from each other, may still be connected to each other.

As further shown in FIG. 2, each of these BOX'es 106A and 106B has at least one sidewall, edge, or otherwise side connected to the isolation structure 104. For example, the BOX 106A has two of its sidewalls connected to the isolation structure 104, respectively. In another example, the BOX 106B, vertically below the BOX 106A, has three of its sidewalls connected to the isolation structure 104, respectively. In various embodiments, the isolation structure 104 is implemented as a shallow trench isolation (STI) that is configured to (e.g., electrically) isolate the SOI device 100 from other devices (e.g., transistors) formed on the same substrate 102. Accordingly, the isolation structure 104 is sometimes referred to as "STI 104."

Figure 3:
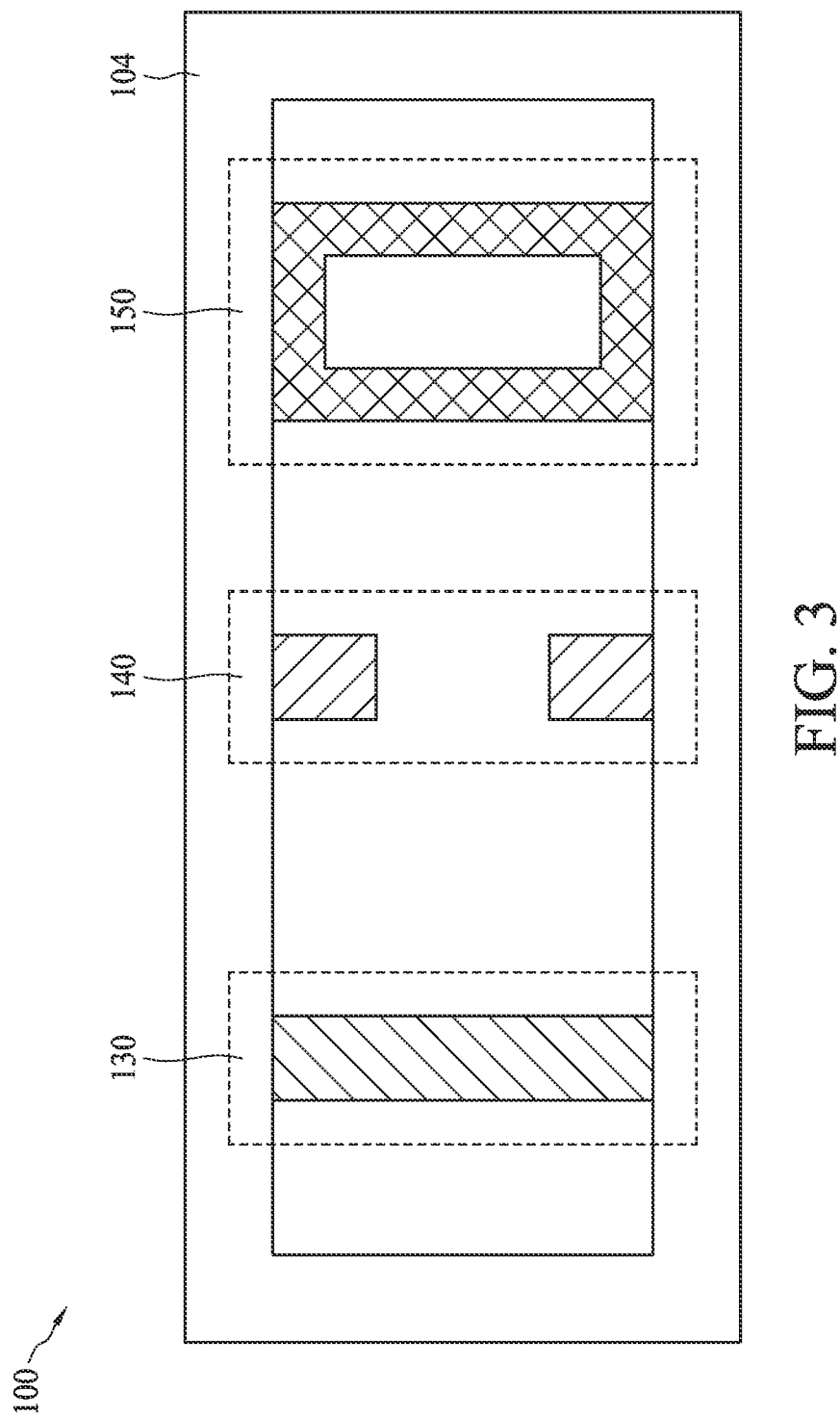
FIGS. 3, 4, 5, 6, 7, 8, and 9 illustrate cross-sectional views of the SOI device of FIG. 1 each including a respective number of BOX'es, in accordance with some embodiments.

FIG. 3 illustrates various other profiles of BOX'es that the SOI device 100 can include, in accordance with various embodiments. As shown, BOX'es 130, 140, and 150, formed within the active region enclosed by the STI 104, have respectively different profiles. In various embodiments, regardless of the profiles, each of the BOX'es 130 to 150 has at least one sidewall connected to the STI 104. Specifically, the BOX 130 has a stripe profile extending through the active region enclosed by the STI 104, with two of BOX 130's sidewalls connected to the STI 104; the BOX 140 has two discrete portions, with their respective sidewalls connected to the STI 104; and the BOX 150 has a ring shape, with two of BOX 150's outer sidewalls connected to the STI 104. It should be understood that the profiles of BOX'es 130 to 150 are simply provided as examples. As a result, the SOI device 100 (or any SOI device formed by the disclosed methods) can include each of its one or more BOX'es formed in any of various profiles (as long as having at least one sidewall connected to a corresponding STI), while remaining within the scope of present disclosure.

Further, FIGS. 4, 5, 6, 7, 8, and 9 respectively illustrate cross-sectional views of various other embodiments of the SOI device 100, including one or more BOX'es, that is formed by the disclosed method. Each of the examples shown in FIGS. 4 to 9 has similar device features to the SOI device 100 illustrated in FIGS. 1-2, except for the respective BOX structure(s) or its/their arrangement(s). Thus, detailed description of duplicated portion thereof is omitted herein for the sake of brevity.

Figure 4:
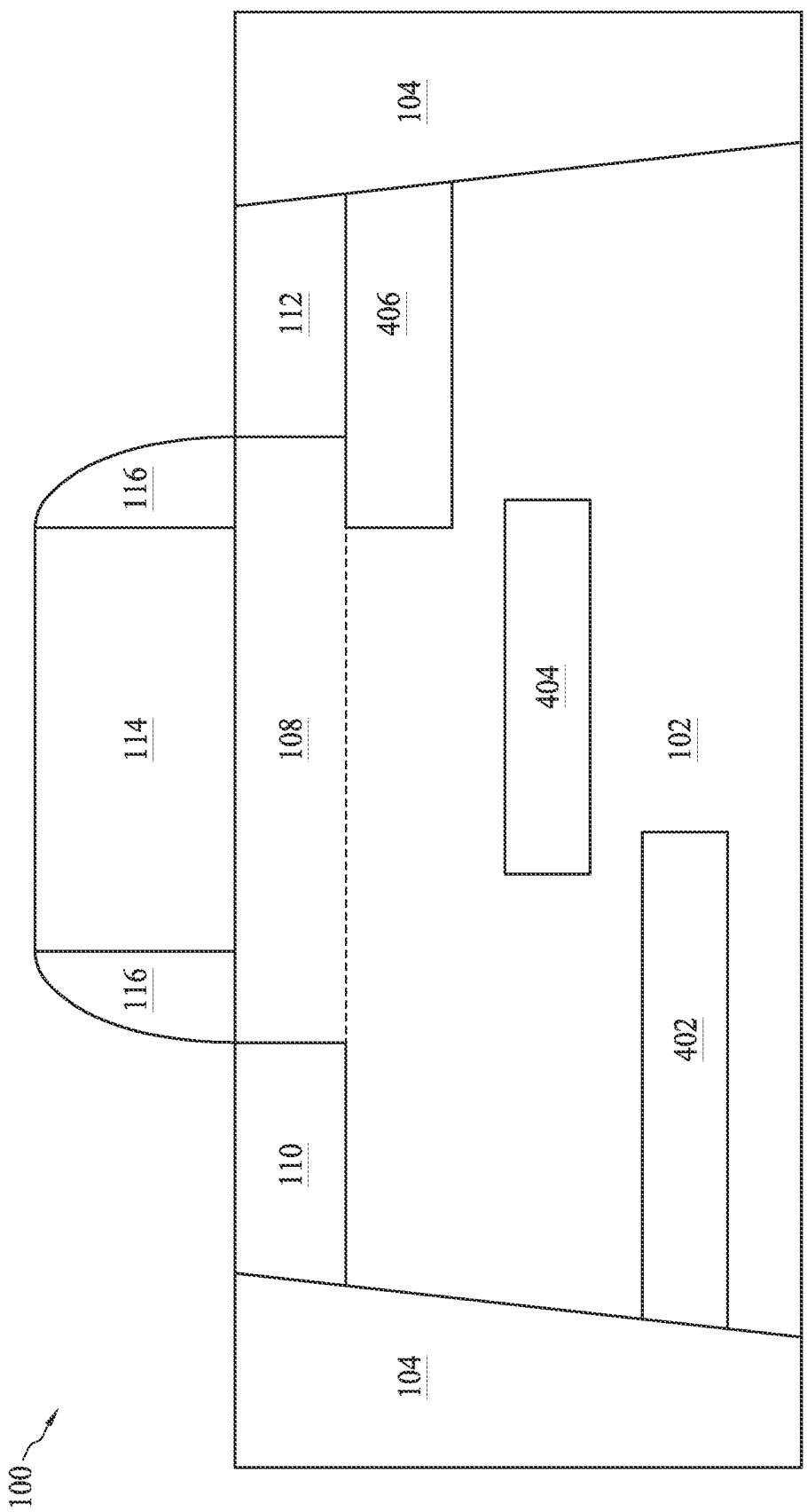

In FIG. 4, the SOI device 100 includes three BOX'es, 402, 404, and 406 formed in the lower silicon layer 102. The BOX'es 402 to 406 are laterally offset from one another, and vertically spaced apart from one another. Further, the BOX 406 has a portion of its top surface in contact with the upper silicon layer 108 or the source/drain structure 112 formed therein. In some embodiments, the upper silicon layer 108 has a portion of its bottom surface in contact with the lower silicon layer 102, which allows the SOI device 100 (of FIG. 4) to operate in a partially depleted regime. Although, in the illustrated example of FIG. 4, only the BOX 406 is connected to the STI 104, it should be understood that other two BOX'es 402 and 404 should also have at least one sidewall connected to the STI 104 in accordance with various embodiments of present disclosure.

Figure 5:
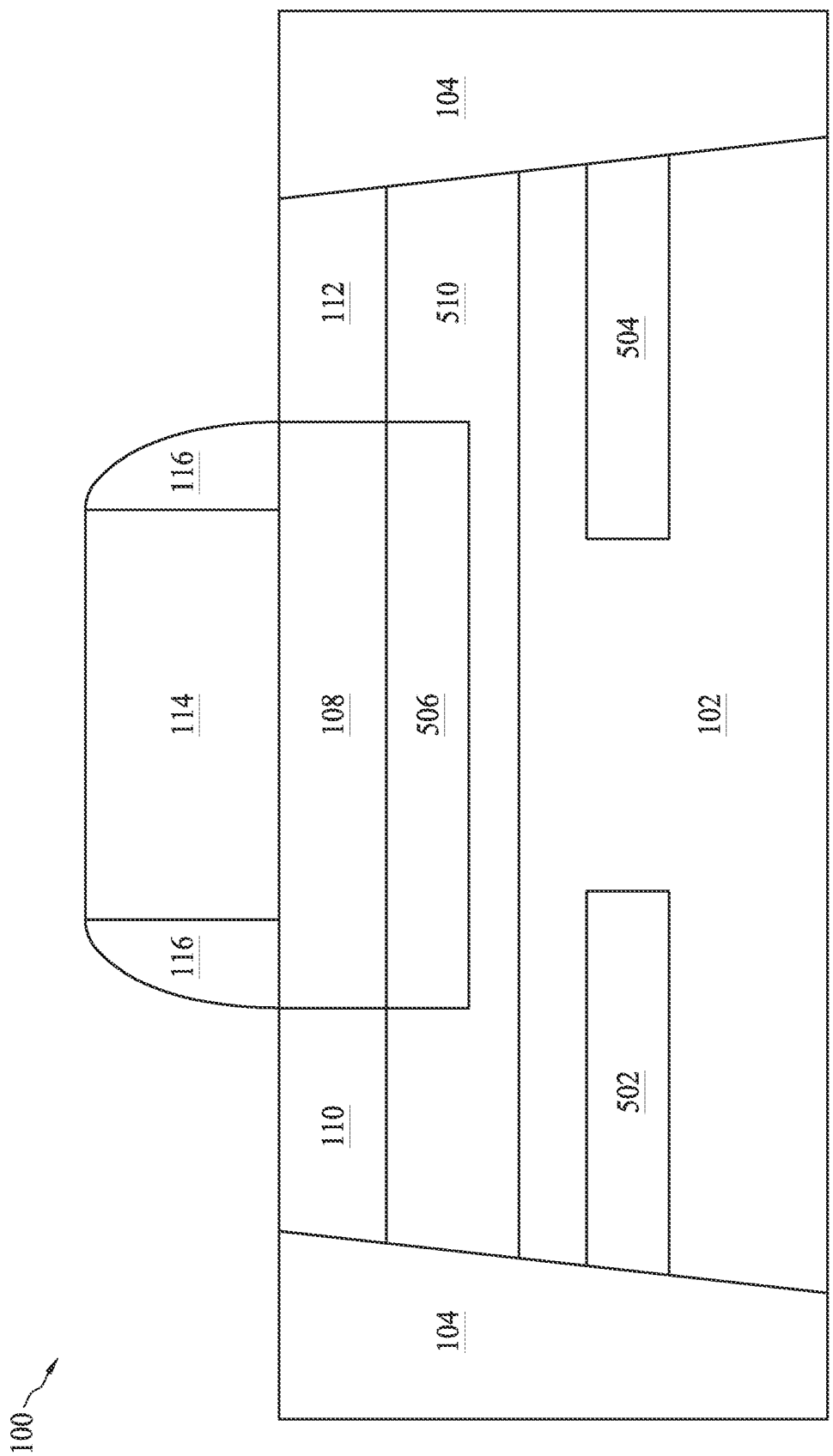

In FIG. 5, the SOI device 100 includes three BOX'es, 502 and 504 formed in the lower silicon layer 102, and 506 formed in an intermediate silicon layer 510. In the lower silicon layer 102, the BOX'es 502 and 504 may be formed as discrete components or different portions of an integrally formed BOX structure. The intermediate silicon layer 510 may be epitaxially grown over the lower silicon layer 102, in accordance with various embodiments. The BOX 506 may have a bottom surface spaced apart from an interface between the lower silicon layer 102 and the intermediate silicon layer 510, as shown. However, it should be understood that the bottom surface of the BOX 506 can be formed at such an interface, while remaining within the scope of present disclosure. Further, the BOX 506 is disposed immediately next to the upper silicon layer 108, with no portion of the upper silicon layer 108 in contact with the intermediate or lower silicon layer, which allows the SOI device 100 (of FIG. 5) to operate in a fully depleted regime. Although, in the illustrated example of FIG. 5, only the BOX'es 502 and 504 are connected to the STI 104, it should be understood that the other BOX 506 should also have at least one sidewall connected to the STI 104 in accordance with various embodiments of present disclosure.

Figure 6:
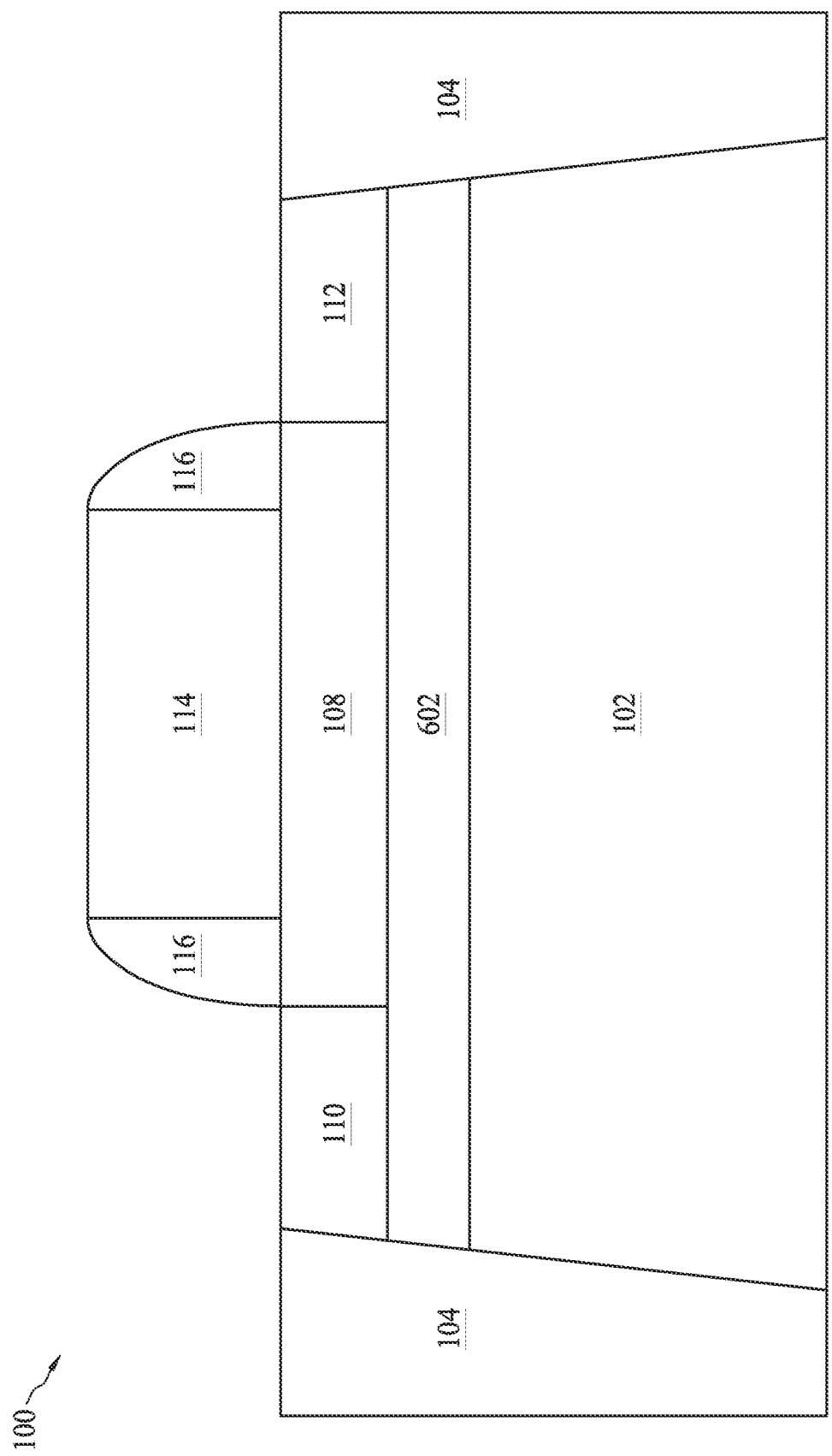

In FIG. 6, the SOI device 100 includes a single BOX 602 formed in the lower silicon layer 102. The BOX 602 is disposed immediately next to the upper silicon layer 108, with no portion of the upper silicon layer 108 in contact with the lower silicon layer 102, which allows the SOI device 100 (of FIG. 6) to operate in a fully depleted regime. Further, the BOX 602 can laterally extend from one side of the STI 104, through the source/drain structure 110, the upper silicon layer 108 and the source/drain structure 112, and to the other opposite side of the STI 104.

Figure 7:
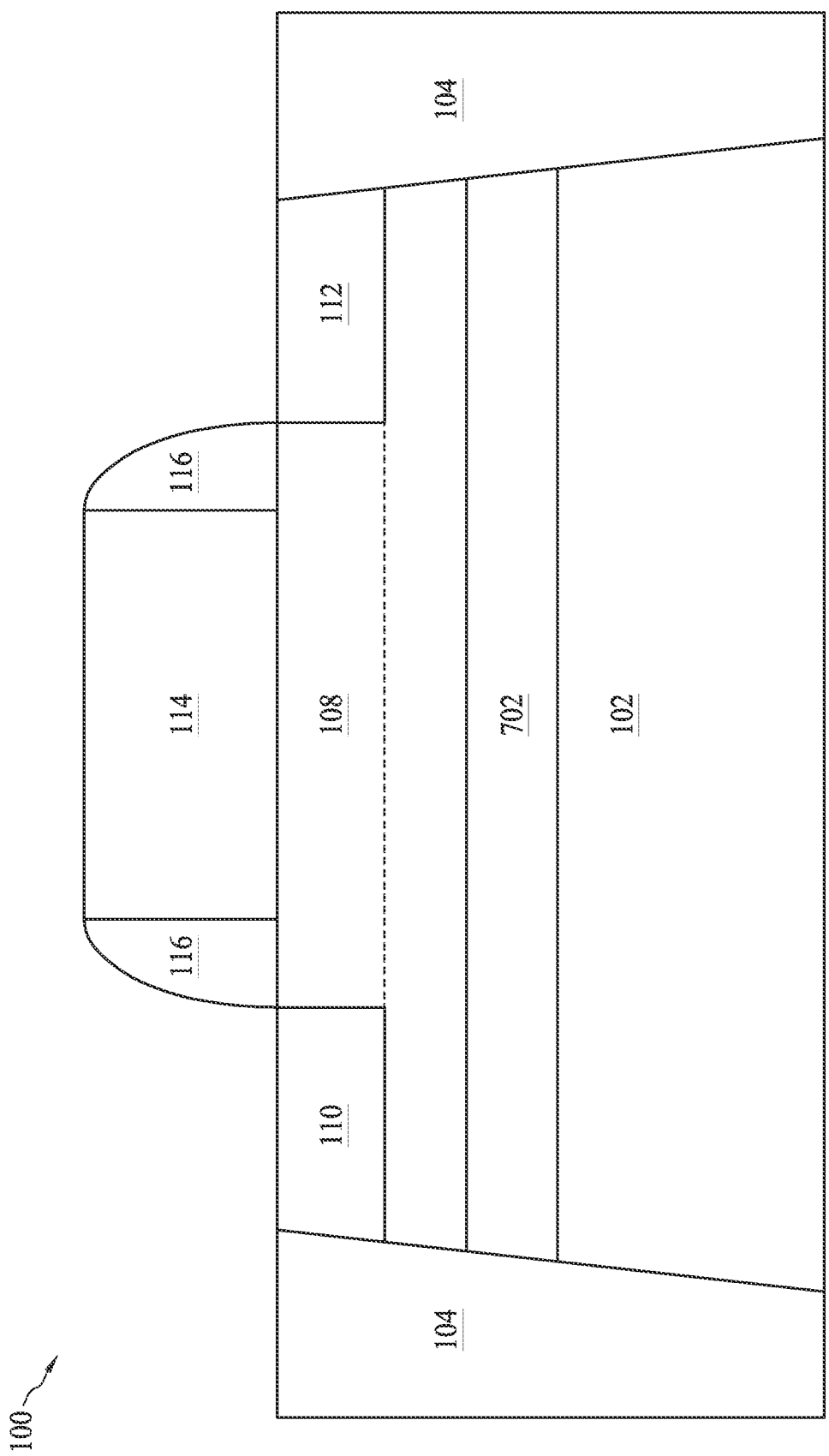

In FIG. 7, the SOI device 100 includes a single BOX 702 formed in the lower silicon layer 102. The BOX 702 is disposed below the upper silicon layer 108, with a portion of the lower silicon layer 102 interposed between itself and the upper silicon layer 108, which allows the SOI device 100 (of FIG. 7) to operate in a partially depleted regime. Further, the BOX 702 can laterally extend from one side of the STI 104, through the source/drain structure 110, the upper silicon layer 108 and the source/drain structure 112, and to the other opposite side of the STI 104.

Figure 8:
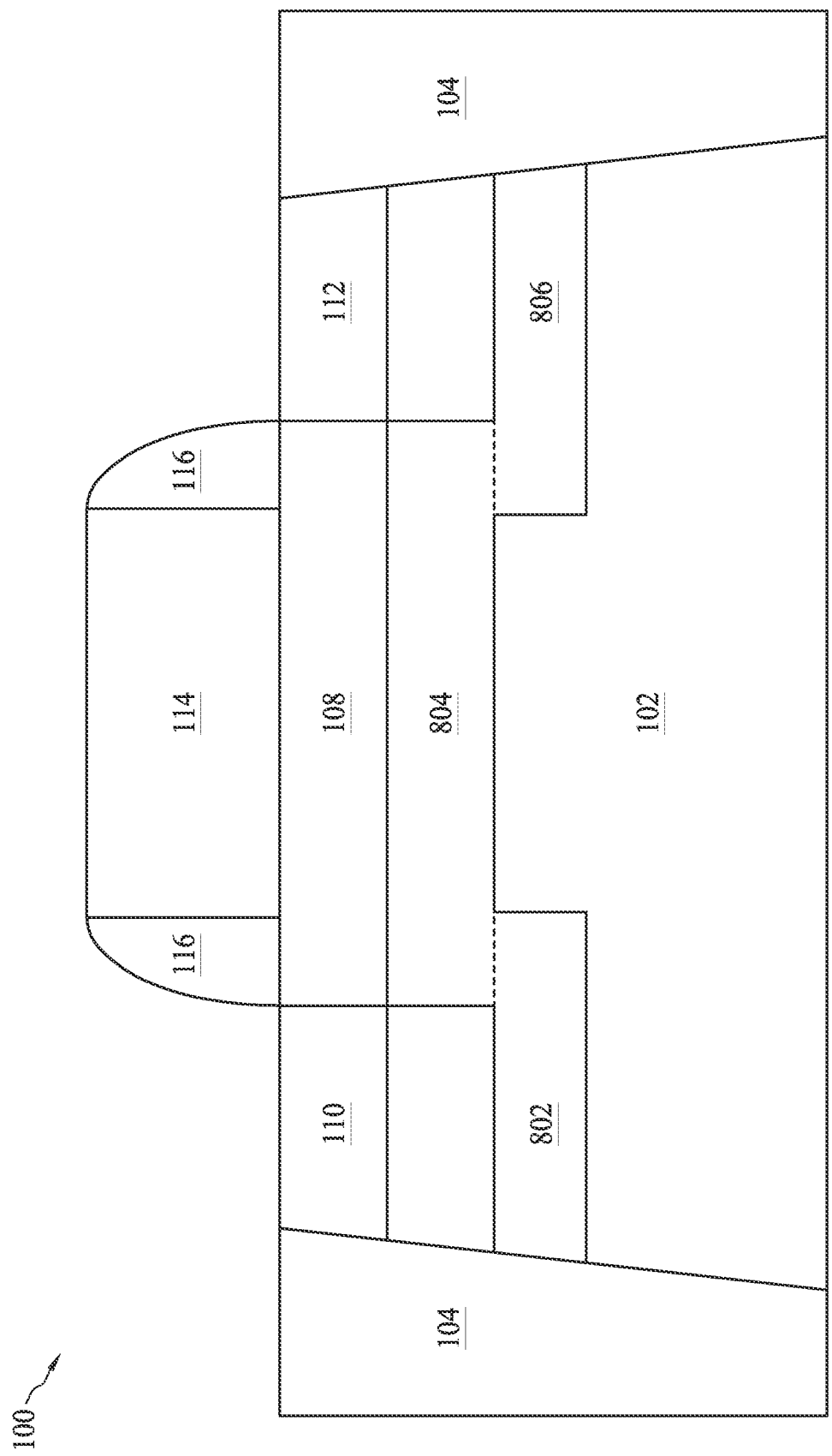

In FIG. 8, the SOI device 100 includes three BOX'es, 802, 804, and 806 formed in the lower silicon layer 102. The BOX'es 802 to 806 are laterally offset from one another, with the BOX'es 802 and 804 vertically connected to each other and the BOX'es 806 and 804 vertically connected to each other. In some embodiments, the BOX 804 is disposed immediately next to the upper silicon layer 108, with no portion of the upper silicon layer 108 in contact with the lower silicon layer 102, which allows the SOI device 100 (of FIG. 8) to operate in a fully depleted regime. Further, the BOX'es 802 and 806 are vertically spaced from the source/drain structures 110 and 112, respectively, with portions of the lower silicon layer 102. Although, in the illustrated example of FIG. 8, only the BOX'es 802 and 806 are connected to the STI 104, it should be understood that other BOX 804 should also have at least one sidewall connected to the STI 104 in accordance with various embodiments of present disclosure. As mentioned above, with these vertically offset BOX'es (e.g., 802, 804, 806) connected to each other, the SOI device 100 may tolerate more mechanical stress.

Figure 9:
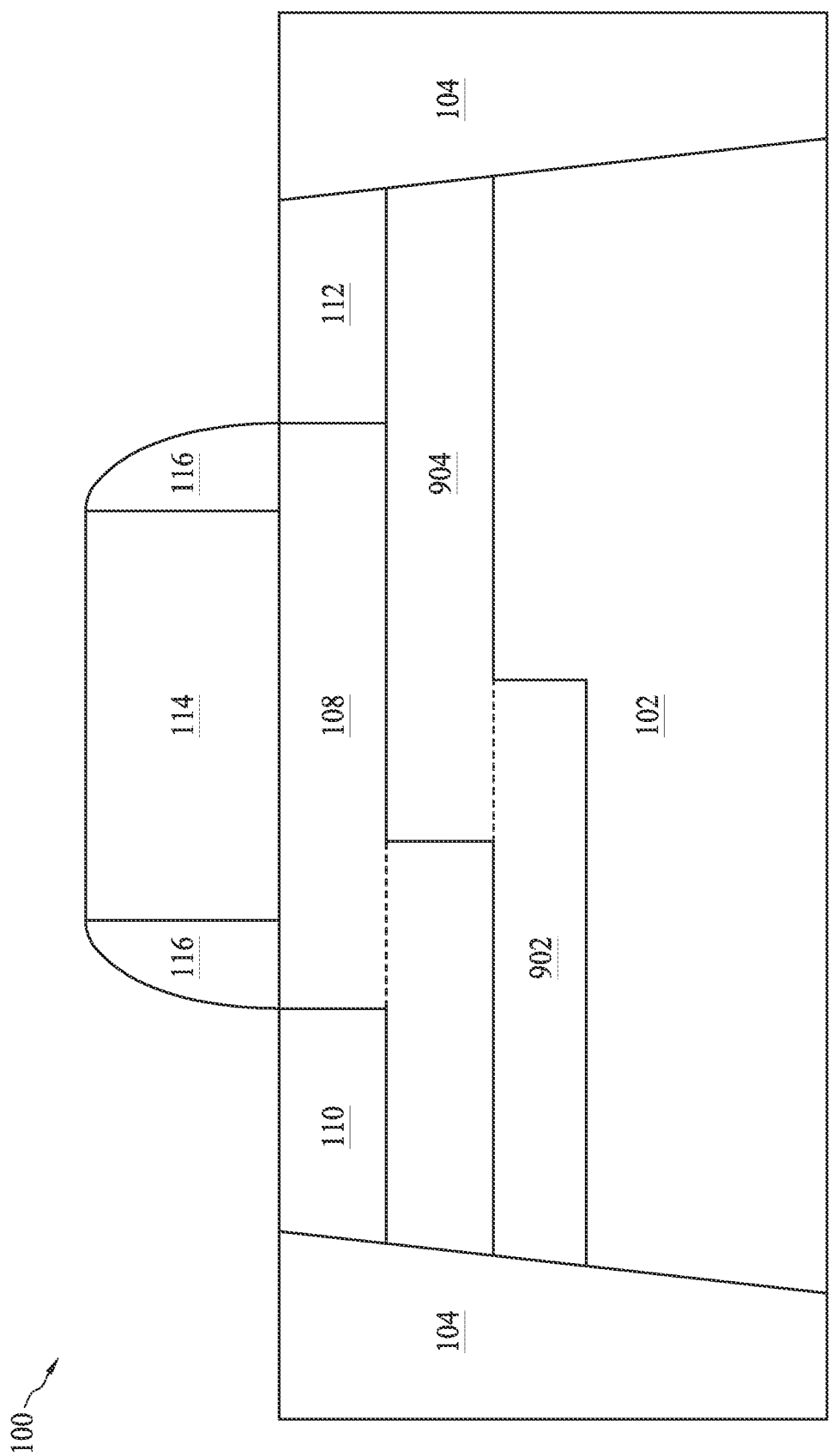

In FIG. 9, the SOI device 100 includes two BOX'es, 902 and 904, formed in the lower silicon layer 102. The BOX'es 902 to 904 are laterally offset from one another, and vertically connected to each other. In some embodiments, the BOX 904 is disposed immediately next to the upper silicon layer 108, with a portion of the upper silicon layer 108 in contact with the lower silicon layer 102, which allows the SOI device 100 (of FIG. 9) to operate in a partially depleted regime. Further, the BOX 902 is vertically spaced from the source/drain structure 110 with a portion of the lower silicon layer 102 (interposed therebetween), and the BOX 904 is in contact with the source/drain structure 112 with no portion of the lower silicon layer 102 (interposed therebetween). As mentioned above, with these vertically offset BOX'es (e.g., 902, 904) connected to each other, the SOI device 100 may tolerate more mechanical stress.

Figure 10:
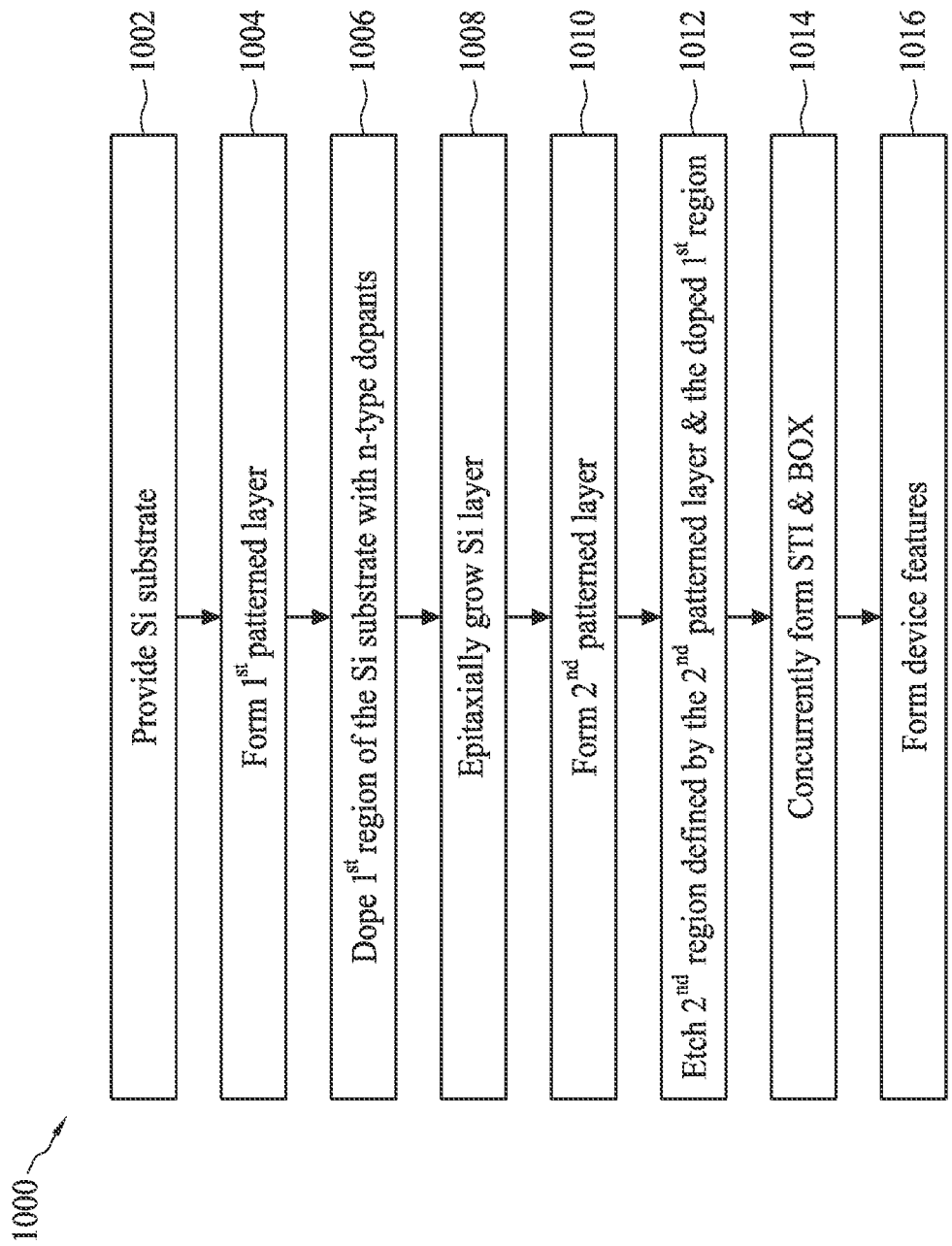
FIG. 10 is an example flow chart of a method for fabricating a semiconductor device, in accordance with some embodiments.

FIG. 10 illustrates a flowchart of an example method 1000 for forming at least a portion of an SOI device 1100 that includes a single BOX, in accordance with some embodiments. It should be noted that the method 1000 is merely an example, and is not intended to limit the present disclosure. Accordingly, it is understood that the order of operation of the method 1000 of FIG. 10 can change, that additional operations may be provided before, during, and after the method 1000 of FIG. 10, and that some other operations may only be described briefly herein. In some embodiments, operations of the method 1000 may be associated with cross-sectional views of the example semiconductor device 1100 at various fabrication stages, as shown in FIGS. 11, 12, 13, 14, 15, 16, 17, and 18, respectively.

In brief overview, the method 1000 starts with operation 1002 of providing a silicon substrate (or a lower silicon layer). The method 1000 continues to operation 1004 of forming a first patterned layer. The method 1000 continues to operation 1006 of doping a first region of the silicon substrate with n-type dopants. The method 1000 continues to operation 1008 of epitaxially growing a (e.g., upper) silicon layer. The method 1000 continues to operation 1010 of forming a second patterned layer. The method 1000 continues to operation 1012 of etching a second region of the substrate defined by the second patterned layer and the doped first region. The method 1000 continues to operation 1014 of concurrently forming a shallow trench isolation (STI) and a buried oxide (BOX). The method 1000 continues to operation 1016 of forming various device features.

Figure 11:
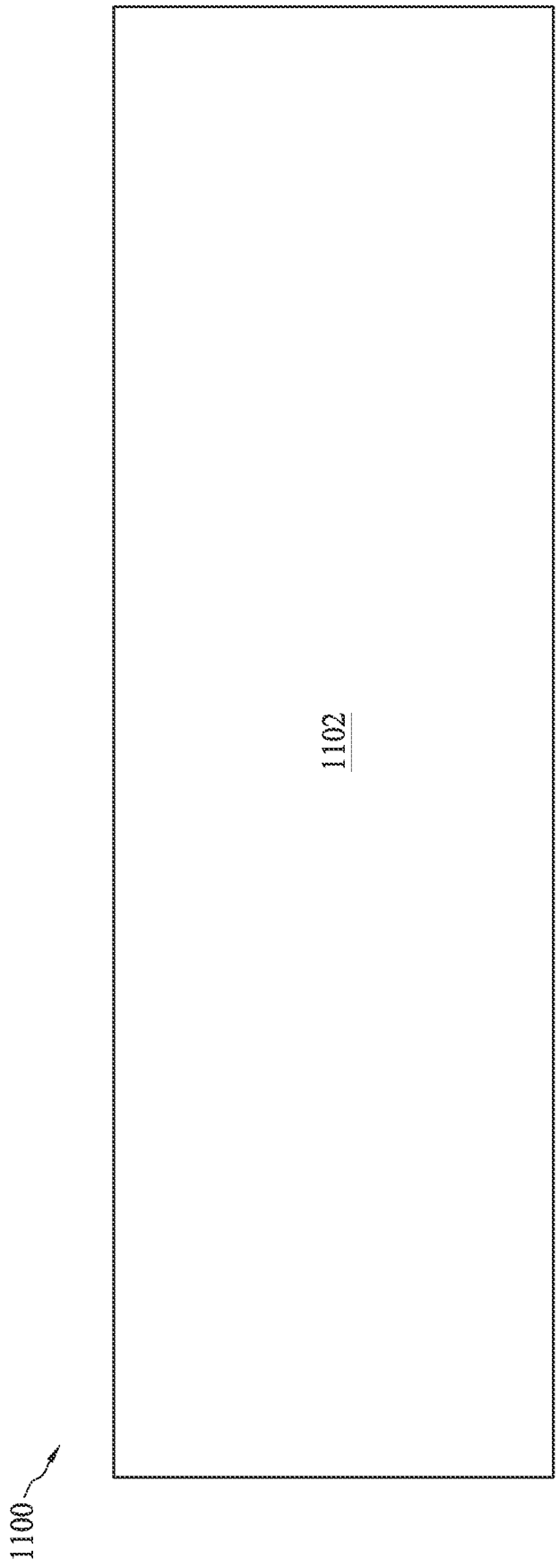
FIGS. 11, 12, 13, 14, 15, 16, 17, and 18 illustrate cross-sectional views of an example semiconductor device (e.g., an SOI device) during various fabrication stages, made by the method of FIG. 10, in accordance with some embodiments.

Corresponding to operation 1002 of FIG. 10, FIG. 11 is a cross-sectional view of the SOI device 1100 including a substrate 1102, in accordance with various embodiments. The cross-sectional view of FIG. 11 is cut along the lengthwise direction of a channel of the SOI device 1100 (e.g., similar to the cross-sectional view shown in FIG. 1).

The substrate 1102 may be a semiconductor substrate, such as a bulk semiconductor, which may be doped (e.g., with a p-type or an n-type dopant) or undoped. In some embodiments, the substrate 1102 may be a wafer, such as a silicon wafer. In some alternative embodiments, the substrate 1102 may be an SOI substrate, which includes a layer of a semiconductor material formed on an insulator layer. The insulator layer may be, for example, a buried oxide layer, a silicon oxide layer, or the like. The insulator layer is provided on a substrate, typically a silicon or glass substrate. Other substrates, such as a multi-layered or gradient substrate may also be used. In various embodiments, the semiconductor material of the substrate 1102 may mainly have silicon, and the substrate 1102 may serve as a lower silicon base layer for the SOI device 1100. Accordingly, the substrate 1102 is herein referred to as silicon substrate 1102 or lower silicon layer 1102. However, it should be understood that the substrate 1102 may include other semiconductor materials such as, for example, germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 12:
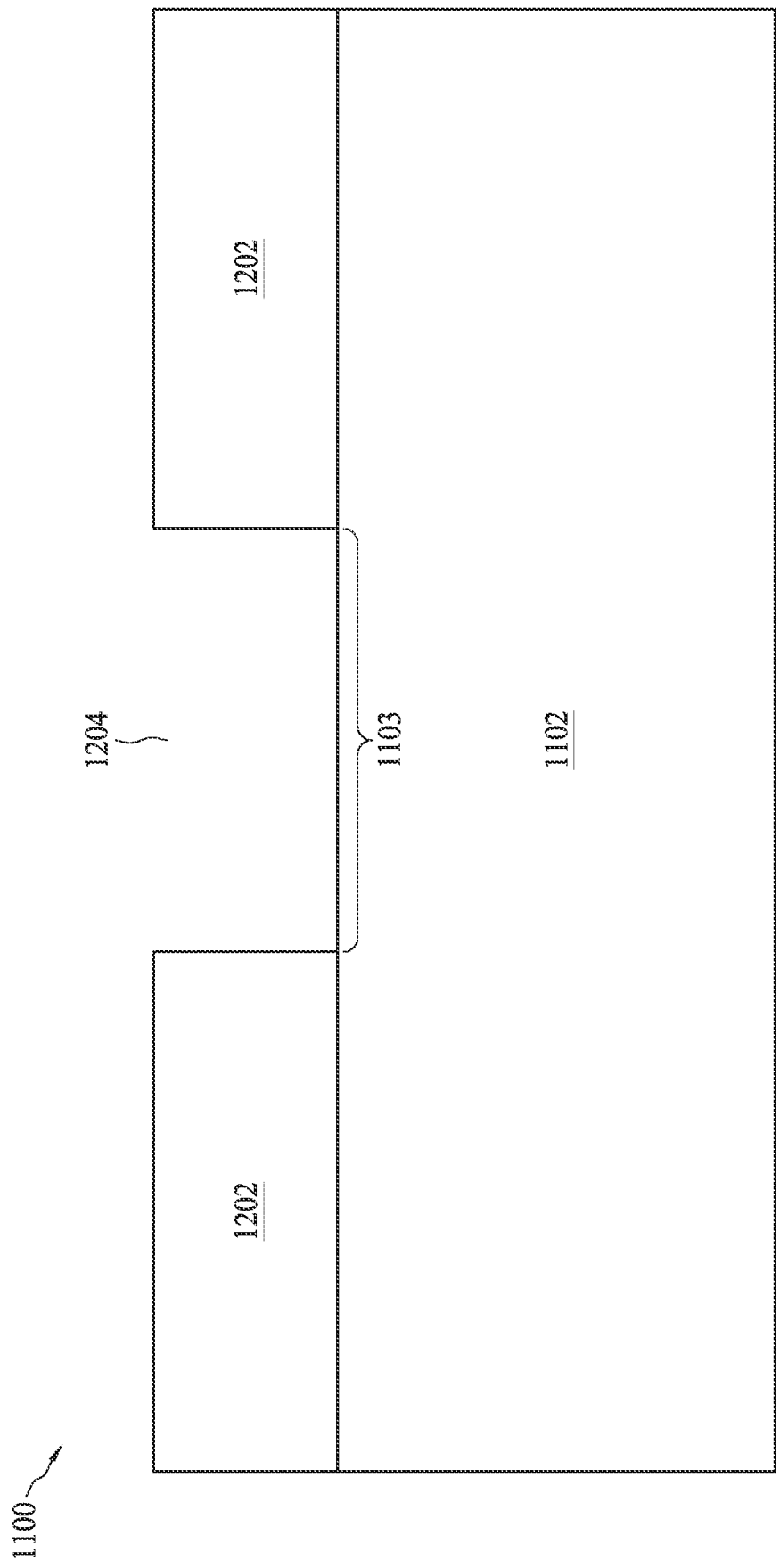

Corresponding to operation 1004 of FIG. 10, FIG. 12 is a cross-sectional view of the SOI device 1100 in which the silicon substrate 1102 is overlaid by a first patterned layer 1202, in accordance with various embodiments. The cross-sectional view of FIG. 12 is cut along the lengthwise direction of a channel of the SOI device 1100 (e.g., similar to the cross-sectional view shown in FIG. 1).

As shown, the first patterned layer 1202 overlays a major surface of the silicon substrate 1102, and has an opening 1204 exposing a first region 1103 of the silicon substrate 1102. As will be discussed below, such a first region may define the footprint of a corresponding BOX formed in the silicon substrate 1102. In some embodiments, the first patterned layer 1202 includes silicon nitride deposited using, for example, low-pressure chemical vapor deposition (LPCVD). In alternative embodiments, the first patterned layer 1202 is formed by thermal nitridation of silicon, chemical vapor deposition (CVD) such as plasma enhanced CVD (PECVD), low pressure CVD (LPCVD), or plasma anodic nitridation using nitrogen-hydrogen. In different embodiments, the first patterned layer 1202 includes silicon nitride, silicon oxy-nitride, titanium nitride, silicon containing ARC layer, amorphous carbon layer and/or a silicon-containing low-k layer. After the deposition (e.g., as a blanket layer), the first patterned layer 1202 is then "patterned" using an anisotropic etching process thereby exposing the first region 1103. Although the first patterned layer 1202 is shown as a single layer in the illustrated example of FIG. 12, the first patterned layer 1202 may comprise multiple layers. For example, other than the silicon nitride layer, the first patterned layer 1202 may include a pad layer (formed of silicon oxide) beneath the silicon nitride layer and a tetraethoxysilane (TEOS) layer above the silicon nitride layer.

Figure 13:
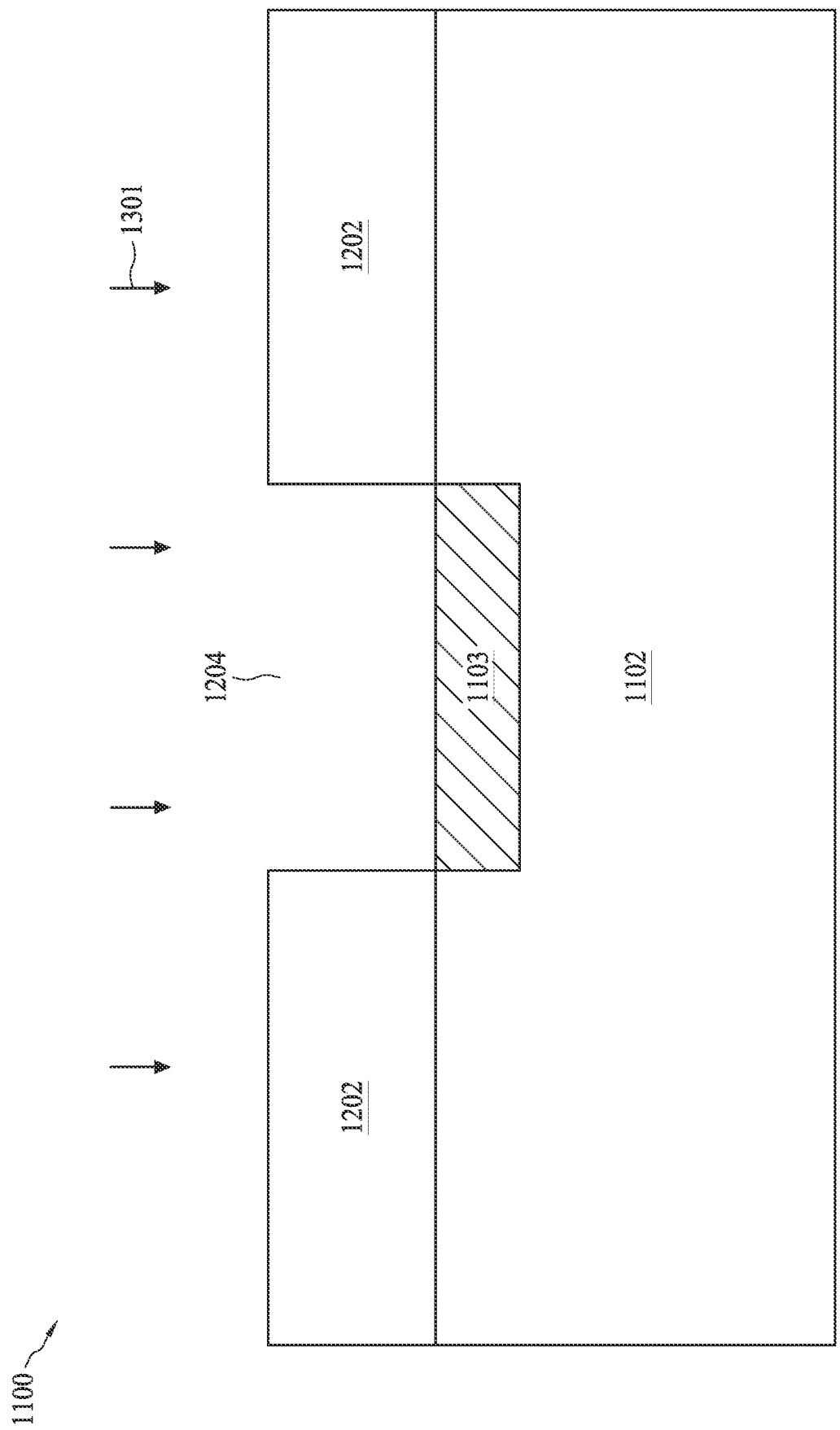

Corresponding to operation 1006 of FIG. 10, FIG. 13 is a cross-sectional view of the SOI device 1100 in which the first region 1103 of the silicon substrate 1102 is doped, in accordance with various embodiments. The cross-sectional view of FIG. 13 is cut along the lengthwise direction of a channel of the SOI device 1100 (e.g., similar to the cross-sectional view shown in FIG. 1).

In some embodiments, an (e.g., ion) implanting process 1301 is used to dope the first region 1103 through the opening 1204. Further, the first region 1103 is doped with one or more n-type dopants such as, for example, phosphorus (P), arsenic (As), antimony (Sb). In the illustrated example of FIG. 13, the implanting process 1301 can be controlled with a certain energy level such that the "doped" region 1103 is present along the major surface of the silicon substrate 1102. Alternatively stated, the doped region 1103 has a top surface level with the major (non-etched) surface of the silicon substrate 1102, i.e., a depth defined as a difference between the top surface of the doped region 1103 and the major surface of the silicon substrate 1102 that is being about zero.

Figure 14:
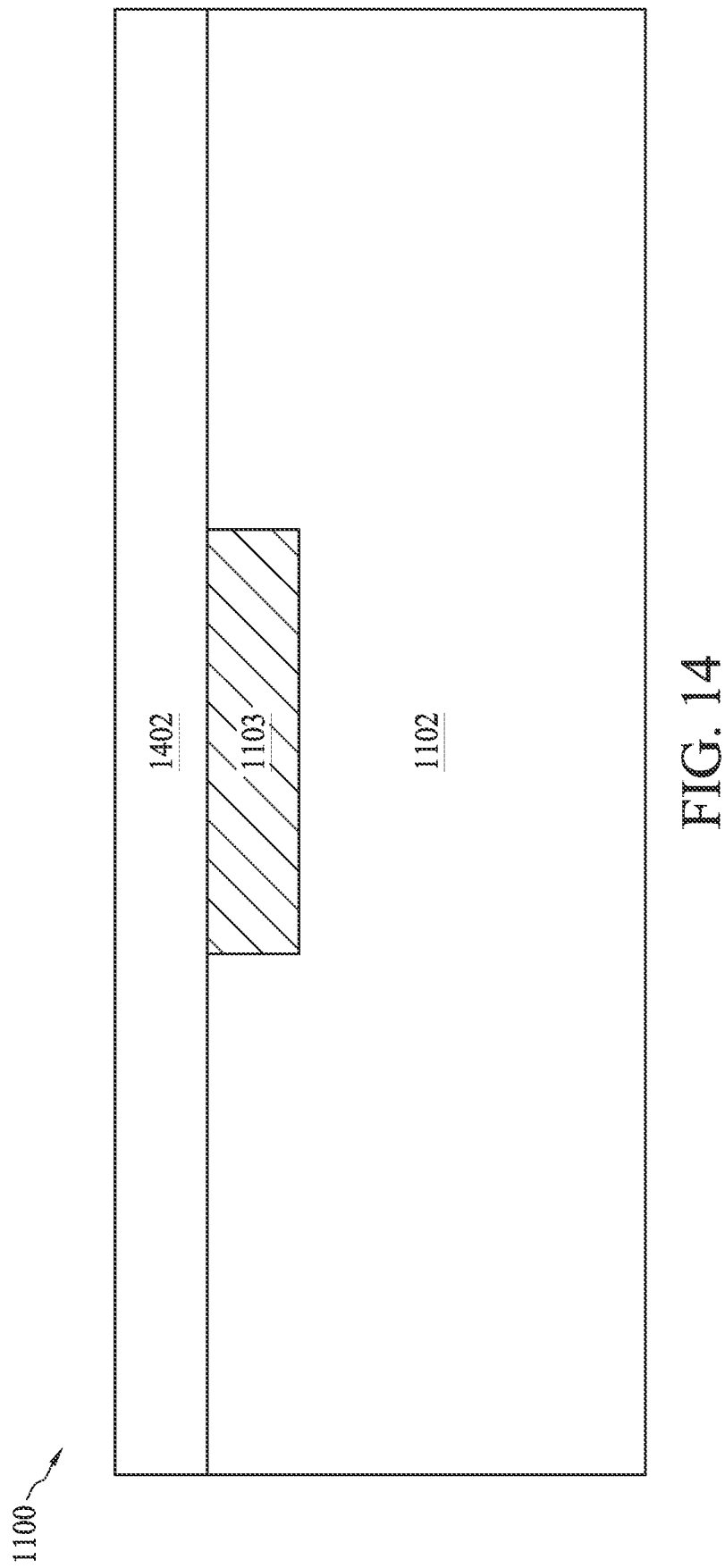

Corresponding to operation 1008 of FIG. 10, FIG. 14 is a cross-sectional view of the SOI device 1100 including a (e.g., upper) silicon layer 1402, in accordance with various embodiments. The cross-sectional view of FIG. 14 is cut along the lengthwise direction of a channel of the SOI device 1100 (e.g., similar to the cross-sectional view shown in FIG. 1).

Upon forming the doped region 1103, the first patterned layer 1202 (FIG. 13) is removed. Next, the upper silicon layer 1402 is formed over the silicon substrate 1102 and the doped region 1103. In various embodiments, the upper silicon layer 1402 can be epitaxially grown from the silicon substrate 1102. For example, the upper silicon layer 1402 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the silicon substrate 1102 extends upwardly, resulting in the upper silicon layer 1402 having the same crystal orientation with the silicon substrate 1102. In various embodiments, the upper silicon layer 1402 is configured to form a channel, a pair of source/drain structures of the SOI device 1100, which will be discussed below. Depending on a desired conductive type of the SOI device 1100, the upper silicon layer 1402 may be doped with p-type dopants (e.g., boron (B), aluminum (Al), indium (In), gallium (Ga), etc.) or n-type dopants (e.g., phosphorus (P), arsenic (As), antimony (Sb), etc.).

Figure 15:
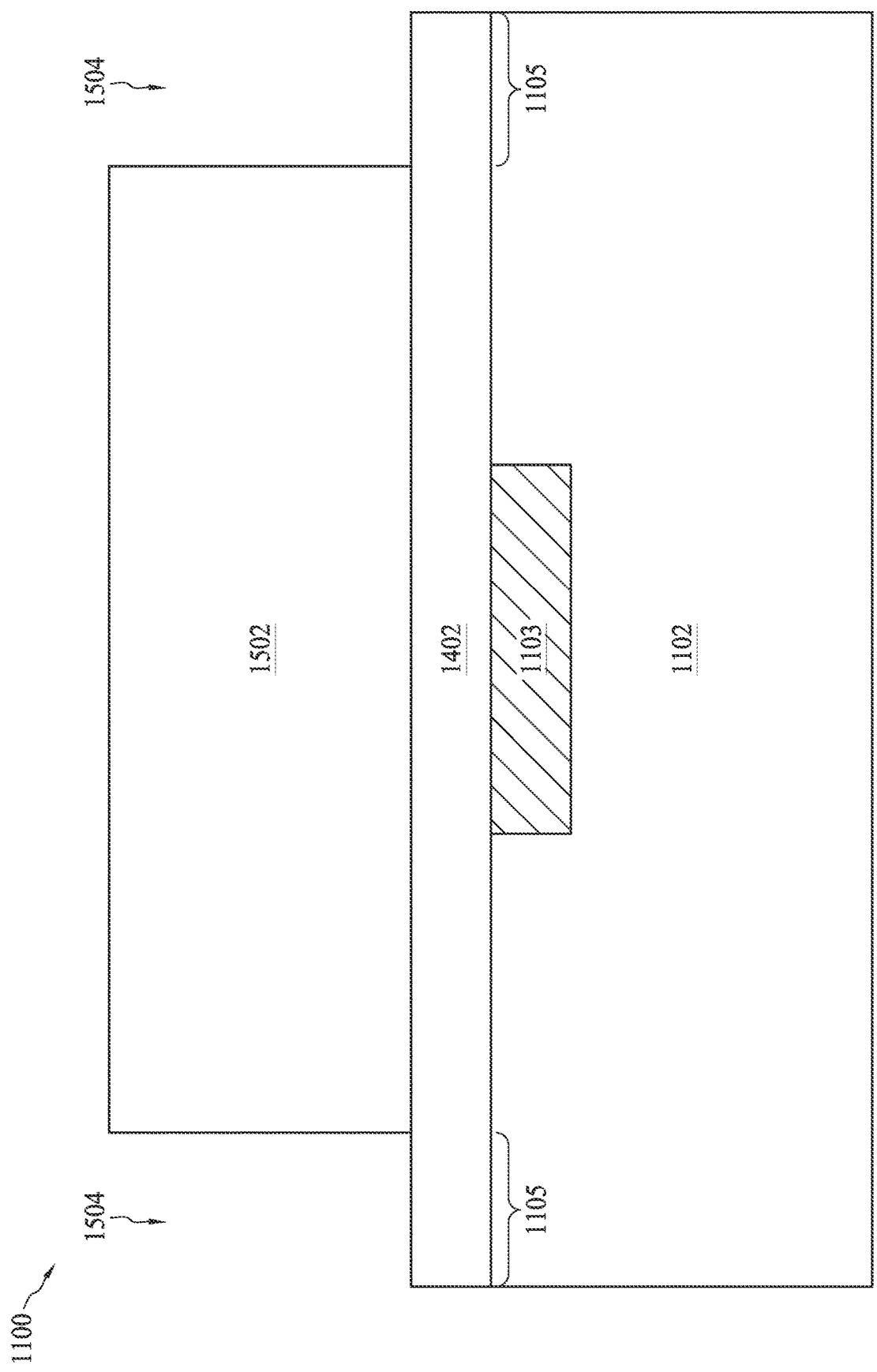

Corresponding to operation 1010 of FIG. 10, FIG. 15 is a cross-sectional view of the SOI device 1100 in which the upper silicon layer 1402 is overlaid by a second patterned layer 1502, in accordance with various embodiments. The cross-sectional view of FIG. 15 is cut along the lengthwise direction of a channel of the SOI device 1100 (e.g., similar to the cross-sectional view shown in FIG. 1).

As shown, the second patterned layer 1502 overlays a major surface of the upper silicon layer 1402, and has an opening 1504 defining a second region 1105 of the silicon substrate 1102 (with the upper silicon layer 1402 disposed thereupon). As will be discussed below, such a second region may define the footprint of a corresponding STI formed in the silicon substrate 1102. In some embodiments, the second patterned layer 1502 includes silicon nitride deposited using, for example, low-pressure chemical vapor deposition (LPCVD). In alternative embodiments, the second patterned layer 1502 is formed by thermal nitridation of silicon, chemical vapor deposition (CVD) such as plasma enhanced CVD (PECVD), low pressure CVD (LPCVD), or plasma anodic nitridation using nitrogen-hydrogen. In different embodiments, the second patterned layer 1502 includes silicon nitride, silicon oxy-nitride, titanium nitride, silicon containing ARC layer, amorphous carbon layer and/or a silicon-containing low-k layer. After the deposition (e.g., as a blanket layer), the second patterned layer 1502 is then "patterned" using an anisotropic etching process thereby defining the second region 1105. Although the second patterned layer 1502 is shown as a single layer in the illustrated example of FIG. 15, the second patterned layer 1502 may comprise multiple layers. For example, other than the silicon nitride layer, the second patterned layer 1502 may include a pad layer (formed of silicon oxide) beneath the silicon nitride layer and a tetraethoxysilane (TEOS) layer above the silicon nitride layer.

Figure 16:
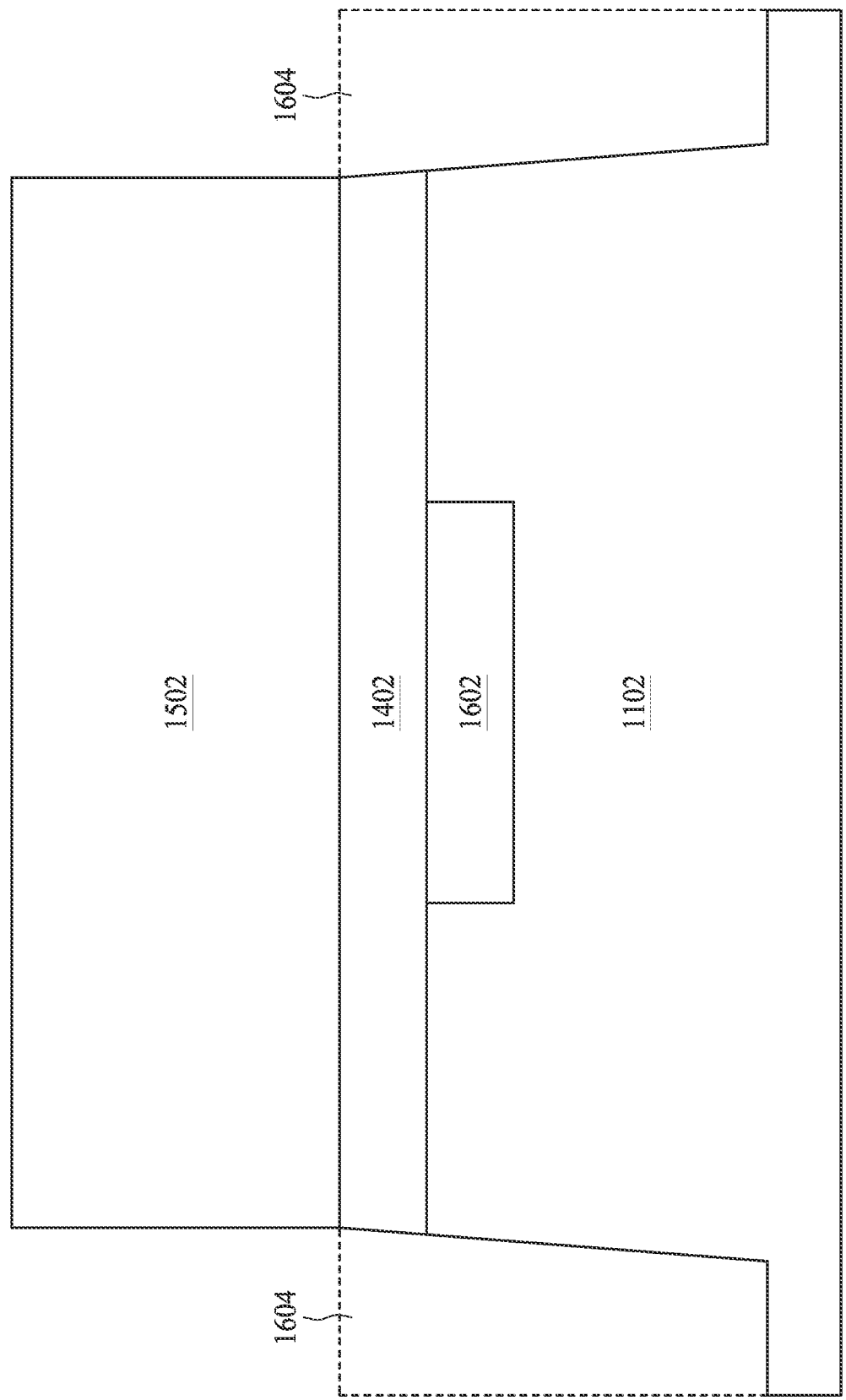

Corresponding to operation 1012 of FIG. 10, FIG. 16 is a cross-sectional view of the SOI device 1100 in which the doped (first) region 1103 and the (second) region 1105, shown in FIG. 15, are removed, in accordance with various embodiments. The cross-sectional view of FIG. 16 is cut along the lengthwise direction of a channel of the SOI device 1100 (e.g., similar to the cross-sectional view shown in FIG. 1).

As shown, the doped region 1103 and the second region 1105 (together with the portion of the upper silicon layer 1402 overlaying the second region 1105) are removed to form recesses 1602 and 1604 in the silicon substrate 1102, respectively. Although not shown in the cross-sectional view of FIG. 16, it should be appreciated that the recess 1604, upon being formed, can expose at least one of the sidewalls of the recess 1602. For example, the recess 1604 may be formed as a trench surrounding a region of the silicon substrate 1102, and the recess 1602 has at least one sidewall or otherwise side connected to such a trench.

In various embodiments, using the second patterned layer 1502 as a mask, the recesses 1602 and 1604 may be formed through a series of etching processes. For example, a first etching process may remove the overlaying portion of the upper silicon layer 1402 and at least some upper portion of the silicon substrate 1102 in the second region 1105. As a result, at least some portion of the sidewall(s) of the doped region 1103 can be exposed. Next, a second etching process may selectively remove the doped region 1103, forming the recess 1602. In various embodiments, the second etching process may laterally etch the doped region 1103 through its exposed sidewall(s). Following the second etching process, a third etching process (similar to the first etching process) may further etch the second region 1105, forming the recess 1604.

As a non-limiting example, the first (and third) etching processes may be configured to have at least some anisotropic etching characteristic. For example, the first (and third) etching processes can include a plasma etching process with a non-zero RF bias power, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, the gas sources and/or the passivation gases can be diluted with gases such as argon (Ar), helium (He), neon (Ne), and other suitable dilutive gases and combinations thereof.

On the other hand, the second etching process may be configured to have at least some isotropic etching characteristic to selectively etch the n-doped region 1103. Alternatively stated, the region of silicon substrate 1103 doped in n-type can present a higher etching rate than other portions of the silicon substrate which are intrinsic or doped in p-type. Further, the higher the concentration of n-type dopants is, the higher the etching rate is, in some embodiments. For example, the second etching process can include a plasma etching process with a zero RF bias power, which can have a certain amount of isotropic characteristic. In such a plasma etching process (including radical plasma etching, remote plasma etching, and other suitable plasma etching processes), gas sources such as chlorine ($Cl_2$), boron trichloride ($BCl_3$), carbon tetrachloride ($CCl_4$), silicon tetrachloride ($SiCl_4$), and other suitable chlorine-based gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, the gas sources and/or the passivation gases can be diluted with gases such as argon (Ar), helium (He), neon (Ne), and other suitable dilutive gases and combinations thereof.

Figure 17:
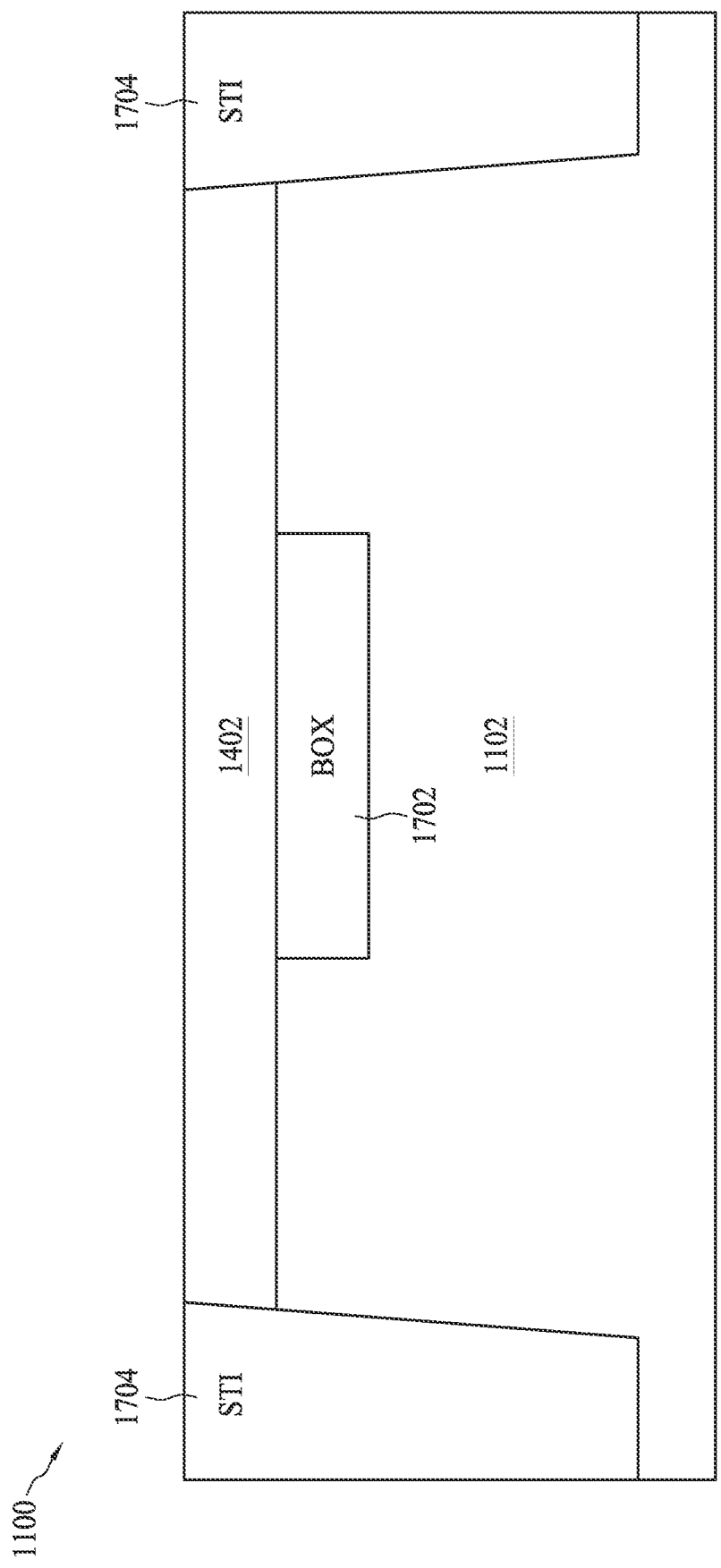

Corresponding to operation 1014 of FIG. 10, FIG. 17 is a cross-sectional view of the SOI device 1100 including a BOX 1702 and an STI 1704 connected to each other, in accordance with various embodiments. The cross-sectional view of FIG. 17 is cut along the lengthwise direction of a channel of the SOI device 1100 (e.g., similar to the cross-sectional view shown in FIG. 1).

Upon forming the recesses 1602 and 1604, a dielectric material is deposited or otherwise formed to fill them. Next, a chemical mechanical polish (CMP) is then performed to planarize the major surface of the upper silicon layer 1402 to concurrently form the BOX 1702 and STI 1704. As such, the BOX 1702 and STI 1704 can inherit the dimensions and profiles of the recesses 1602 and 1604, respectively. For example, the BOX 1702 has at least one of its sidewalls connected to the STI 1704. For another example, the BOX 1702 has a top surface in contact with a bottom surface of the upper silicon layer 1402. In one embodiment, the dielectric material, filling the recesses 1602 and 1604, includes silicon oxide, for example, formed by sub-atmospheric chemical vapor deposition (SA-CVD). In other embodiments, the dielectric material is formed by high-density plasma chemical vapor deposition (HDP-CVD) or spin on glass (SOG). Such a recess fill can be a single material or multiple materials.

Figure 18:
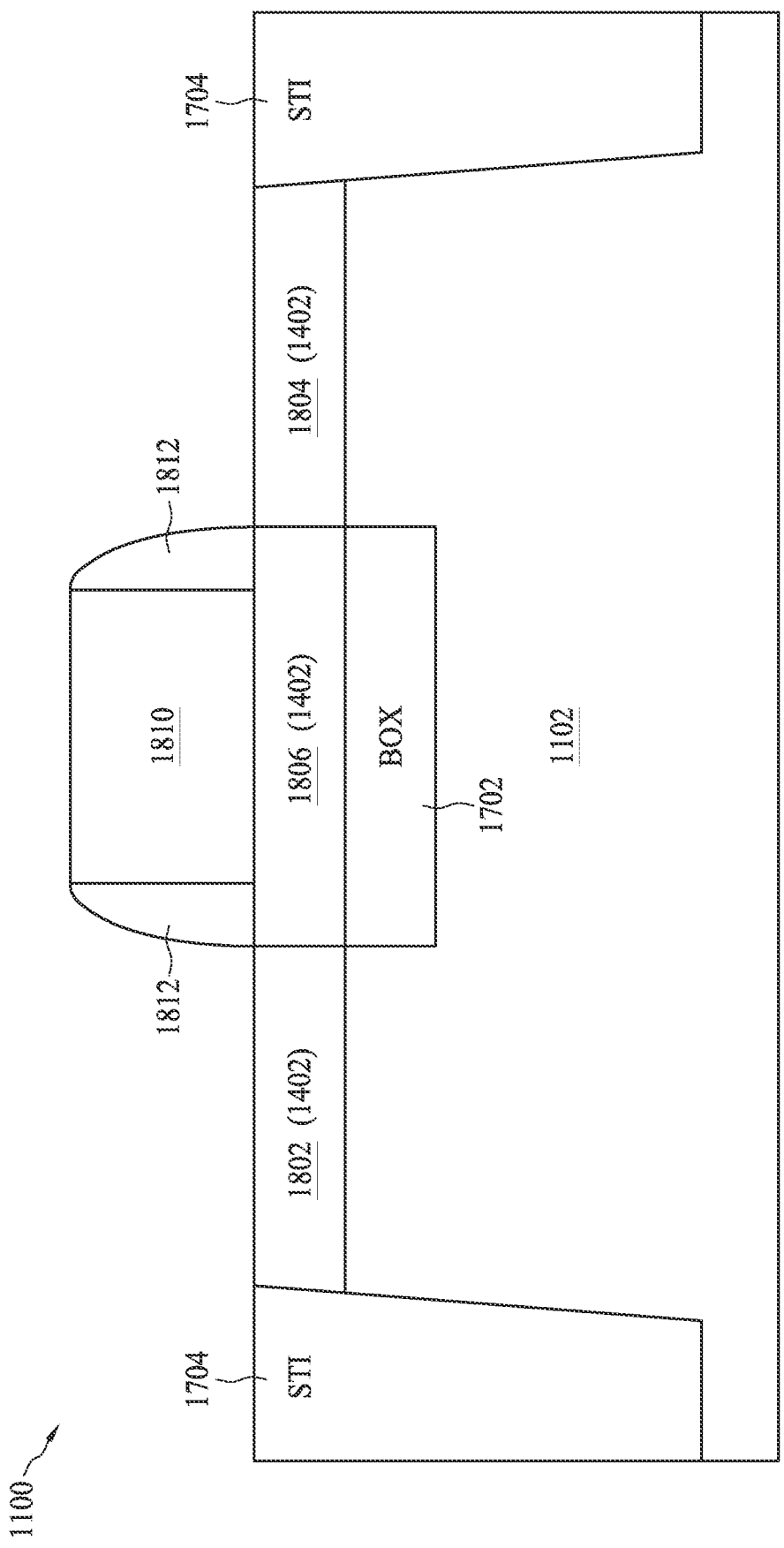

Corresponding to operation 1016 of FIG. 10, FIG. 18 is a cross-sectional view of the SOI device 1100 including a first source/drain structure (or region) 1802, a second source/drain structure (or region) 1804, a channel 1806, a gate structure 1810, and a gate spacer 1812, in accordance with various embodiments. The cross-sectional view of FIG. 18 is cut along the lengthwise direction of a channel of the SOI device 1100 (e.g., similar to the cross-sectional view shown in FIG. 1).

In some embodiments, the source/drain regions 1802-1804 and the channel 1806 are formed in the upper silicon layer 1402. The source/drain regions 1802-1804 may comprise highly doped regions of a first conductivity type, whereas the channel 1806 may comprise an opposite second conductivity type. The gate structure 1810, or sometimes referred to as a gate stack, may include a gate electrode layer formed over a gate dielectric layer, which are not shown separately for the sake of clarity. The gate dielectric layer may be formed of high-k dielectric materials. The gate electrode layer may include metals, metal silicides, polysilicon, metal nitrides, and the like. Such a gate stack may be formed using a gate-first approach or a gate-last approach.

In a gate-first approach, a gate electrode layer is deposited on a gate dielectric layer, both of which are formed as blanket layers. Next, the (blanket) gate dielectric layer and the (blanket) gate electrode layer are patterned to form the gate stack 1810. Next, the gate spacer 1812 is formed on opposite sides of the gate stack 1810. Source/drain regions, 1802 and 1804, are then formed by implanting the exposed upper silicon layer 1402, followed by an activation annealing. A silicide region (not shown) is formed on the source/drain regions 1802 and 1804. A contact etch stop layer is deposited followed by an inter-layer dielectric, and contact plugs (also not shown).

In a gate-last approach, a dummy gate is deposited on the upper silicon layer 1402 or a blanket gate dielectric layer, followed by patterning process to form a dummy gate stack. In one embodiment, the dummy gate, comprising a layer of TiN or TaN, is deposited followed by a layer of polysilicon. Next, the gate spacer 1812 is formed on opposite sides of the dummy gate stack. Source/drain regions, 1802 and 1804, are then formed by implanting the exposed upper silicon layer 1402, followed by an activation annealing. Source/drain silicides are then formed, followed by the formation of contact etch stop layer, and inter-layer dielectric. The inter-layer dielectric is polished to expose the dummy gate stack, and at least a portion of the dummy gate stack is etched and removed. The etched out portion of the dummy gate stack is replaced by the gate stack 1810. Contact plugs are then formed.

Figure 19:
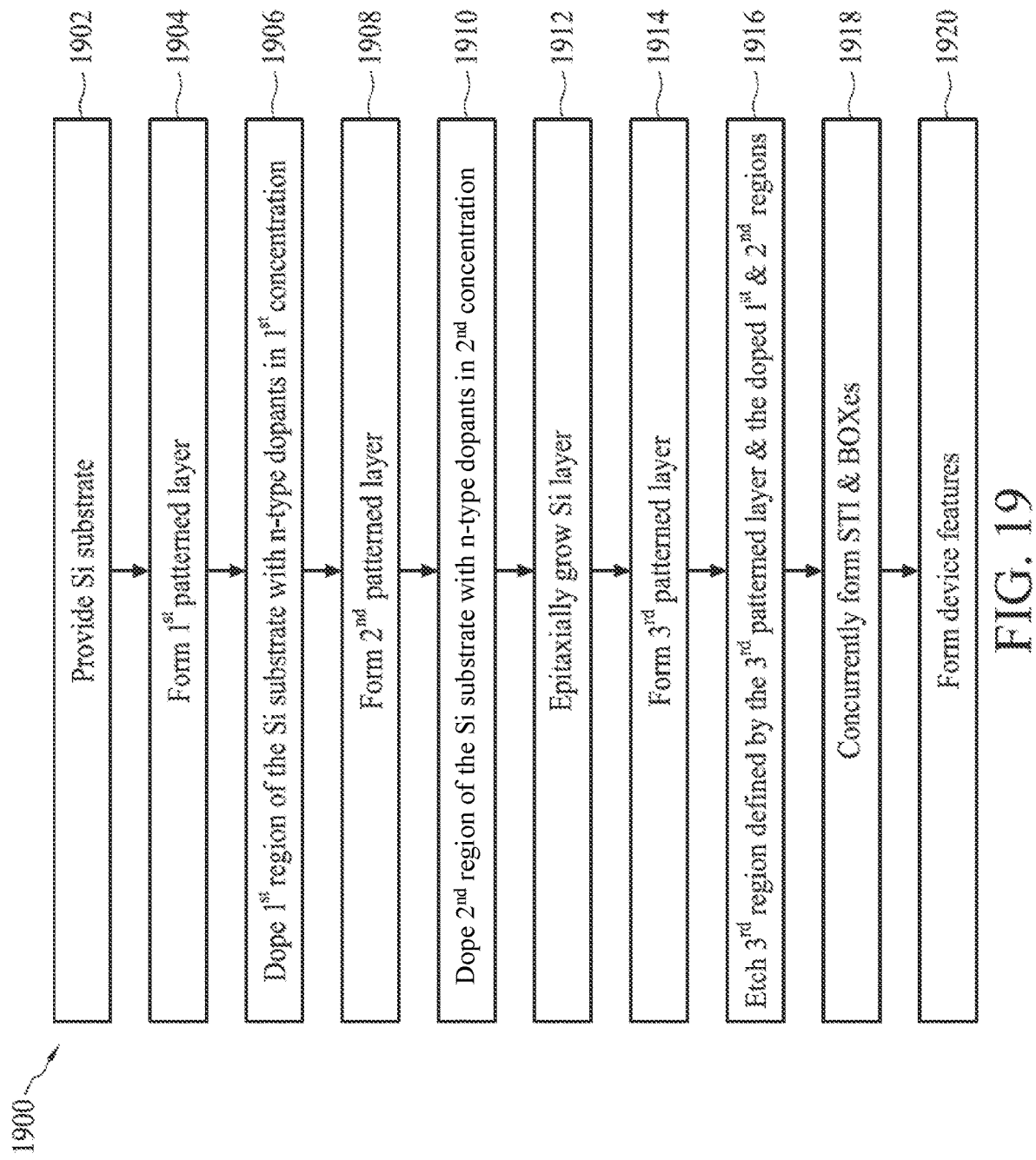
FIG. 19 is an example flow chart of a method for fabricating another example semiconductor device (e.g., an SOI device), in accordance with some embodiments.

FIG. 19 illustrates a flowchart of another example method 1900 for forming at least a portion of an SOI device 2000 that includes multiple BOX'es in different regions of a silicon substrate, in accordance with some embodiments. It should be noted that the method 1900 is merely an example, and is not intended to limit the present disclosure. Accordingly, it is understood that the order of operation of the method 1900 of FIG. 19 can change, that additional operations may be provided before, during, and after the method 1900 of FIG. 19, and that some other operations may only be described briefly herein. In some embodiments, operations of the method 1900 may be associated with cross-sectional views of the example semiconductor device 2000 at various fabrication stages, as shown in FIGS. 20, 21, 22, 23, 24, 25, 26, 27, 28, and 29, respectively.

In brief overview, the method 1900 starts with operation 1902 of providing a silicon substrate (or a lower silicon layer). The method 1900 continues to operation 1904 of forming a first patterned layer. The method 1900 continues to operation 1906 of doping a first region of the silicon substrate with n-type dopants in a first concentration. The method 1900 continues to operation 1908 of forming a second patterned layer. The method 1900 continues to operation 1910 of doping a second region of the silicon substrate with n-type dopants in a second concentration. The method 1900 continues to operation 1912 of epitaxially growing a (e.g., upper) silicon layer. The method 1900 continues to operation 1914 of forming a third patterned layer. The method 1900 continues to operation 1916 of etching a third region of the substrate defined by the third patterned layer and the doped first and second regions. The method 1900 continues to operation 1918 of concurrently forming a shallow trench isolation (STI) and multiple buried oxides (BOX'es). The method 1900 continues to operation 1920 of forming various device features.

Figure 20:
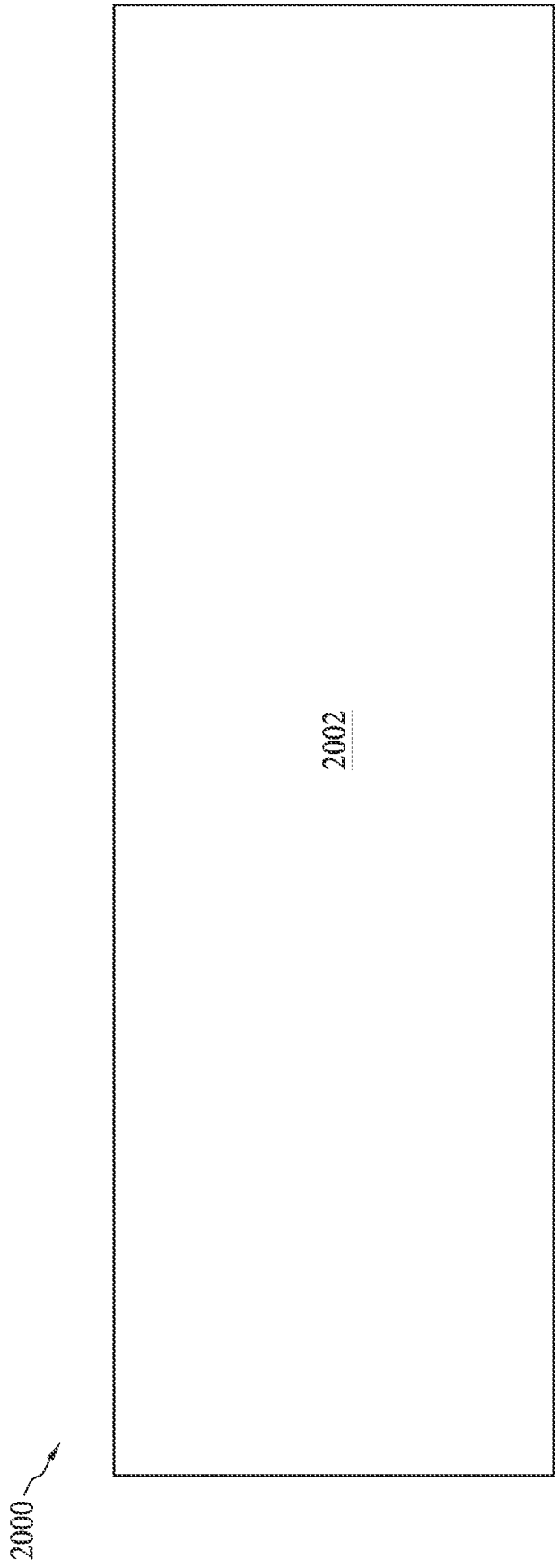
FIGS. 20, 21, 22, 23, 24, 25, 26, 27, 28, and 29 illustrate cross-sectional views of an example semiconductor device during various fabrication stages, made by the method of FIG. 19, in accordance with some embodiments.

Corresponding to operation 1902 of FIG. 19, FIG. 20 is a cross-sectional view of the SOI device 2000 including a substrate 2002, in accordance with various embodiments. The cross-sectional view of FIG. 20 is cut along the lengthwise direction of a channel of the SOI device 2000 (e.g., similar to the cross-sectional view shown in FIG. 1).

The substrate 2002 may be a semiconductor substrate, such as a bulk semiconductor, which may be doped (e.g., with a p-type or an n-type dopant) or undoped. In some embodiments, the substrate 2002 may be a wafer, such as a silicon wafer. In some alternative embodiments, the substrate 2002 may be an SOI substrate, which includes a layer of a semiconductor material formed on an insulator layer. The insulator layer may be, for example, a buried oxide layer, a silicon oxide layer, or the like. The insulator layer is provided on a substrate, typically a silicon or glass substrate. Other substrates, such as a multi-layered or gradient substrate may also be used. In various embodiments, the semiconductor material of the substrate 2002 may mainly have silicon, and the substrate 2002 may serve as a lower silicon base layer for the SOI device 2000. Accordingly, the substrate 2002 is herein referred to as silicon substrate 2002 or lower silicon layer 2002. However, it should be understood that the substrate 2002 may include other semiconductor materials such as, for example, germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 21:
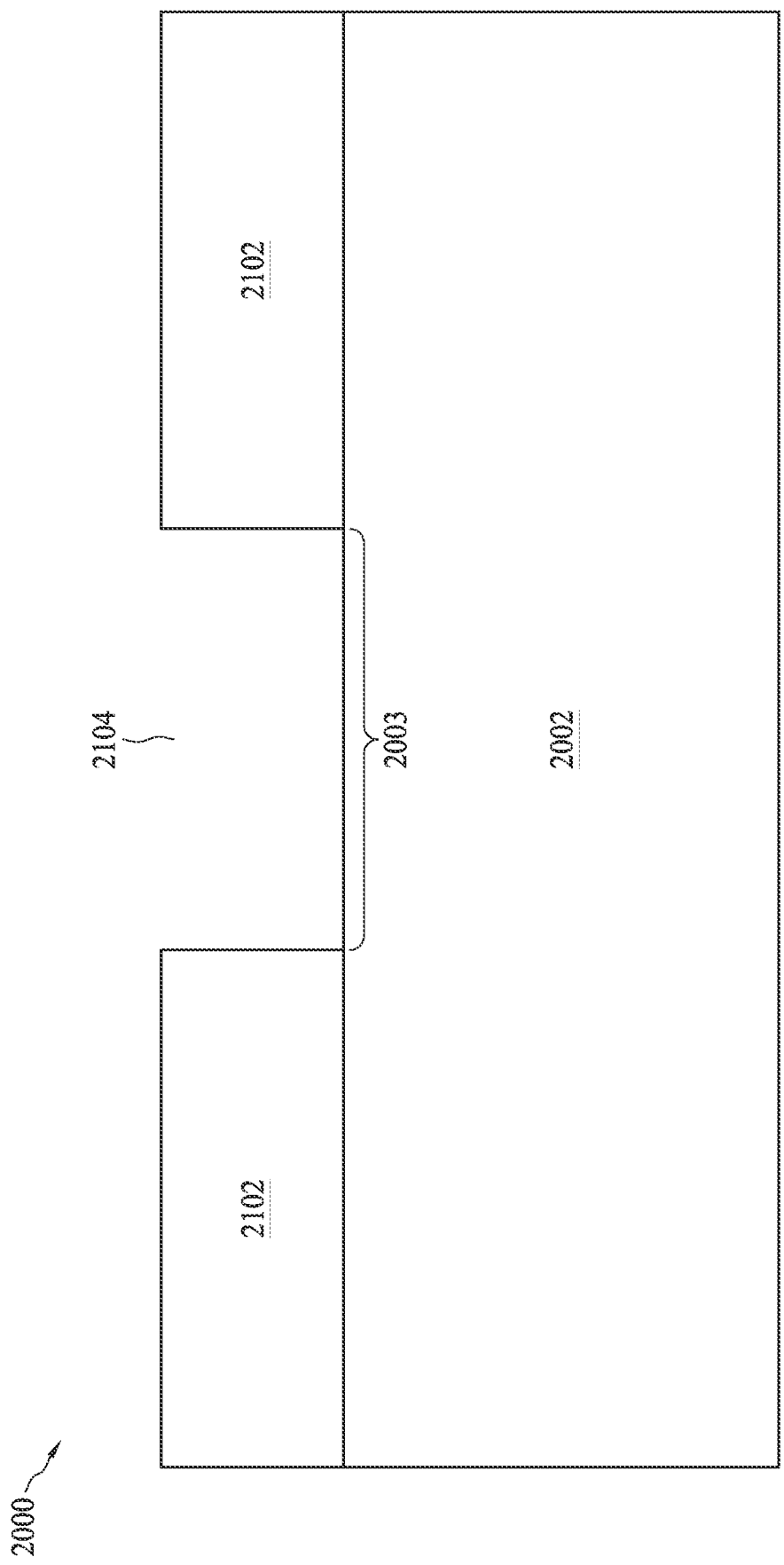

Corresponding to operation 1904 of FIG. 19, FIG. 21 is a cross-sectional view of the SOI device 2000 in which the silicon substrate 2002 is overlaid by a first patterned layer 2102, in accordance with various embodiments. The cross-sectional view of FIG. 21 is cut along the lengthwise direction of a channel of the SOI device 2000 (e.g., similar to the cross-sectional view shown in FIG. 1).

As shown, the first patterned layer 2102 overlays a major surface of the silicon substrate 2002, and has an opening 2104 exposing a first region 2003 of the silicon substrate 2002. As will be discussed below, such a first region may define the footprint of a corresponding BOX formed in the silicon substrate 2002. In some embodiments, the first patterned layer 2102 includes silicon nitride deposited using, for example, low-pressure chemical vapor deposition (LPCVD). In alternative embodiments, the first patterned layer 2102 is formed by thermal nitridation of silicon, chemical vapor deposition (CVD) such as plasma enhanced CVD (PECVD), low pressure CVD (LPCVD), or plasma anodic nitridation using nitrogen-hydrogen. In different embodiments, the first patterned layer 2102 includes silicon nitride, silicon oxy-nitride, titanium nitride, silicon containing ARC layer, amorphous carbon layer and/or a silicon-containing low-k layer. After the deposition (e.g., as a blanket layer), the first patterned layer 2102 is then "patterned" using an anisotropic etching process thereby exposing the first region 2003. Although the first patterned layer 2102 is shown as a single layer in the illustrated example of FIG. 21, the first patterned layer 2102 may comprise multiple layers. For example, other than the silicon nitride layer, the first patterned layer 2102 may include a pad layer (formed of silicon oxide) beneath the silicon nitride layer and a tetraethoxysilane (TEOS) layer above the silicon nitride layer.

Figure 22:
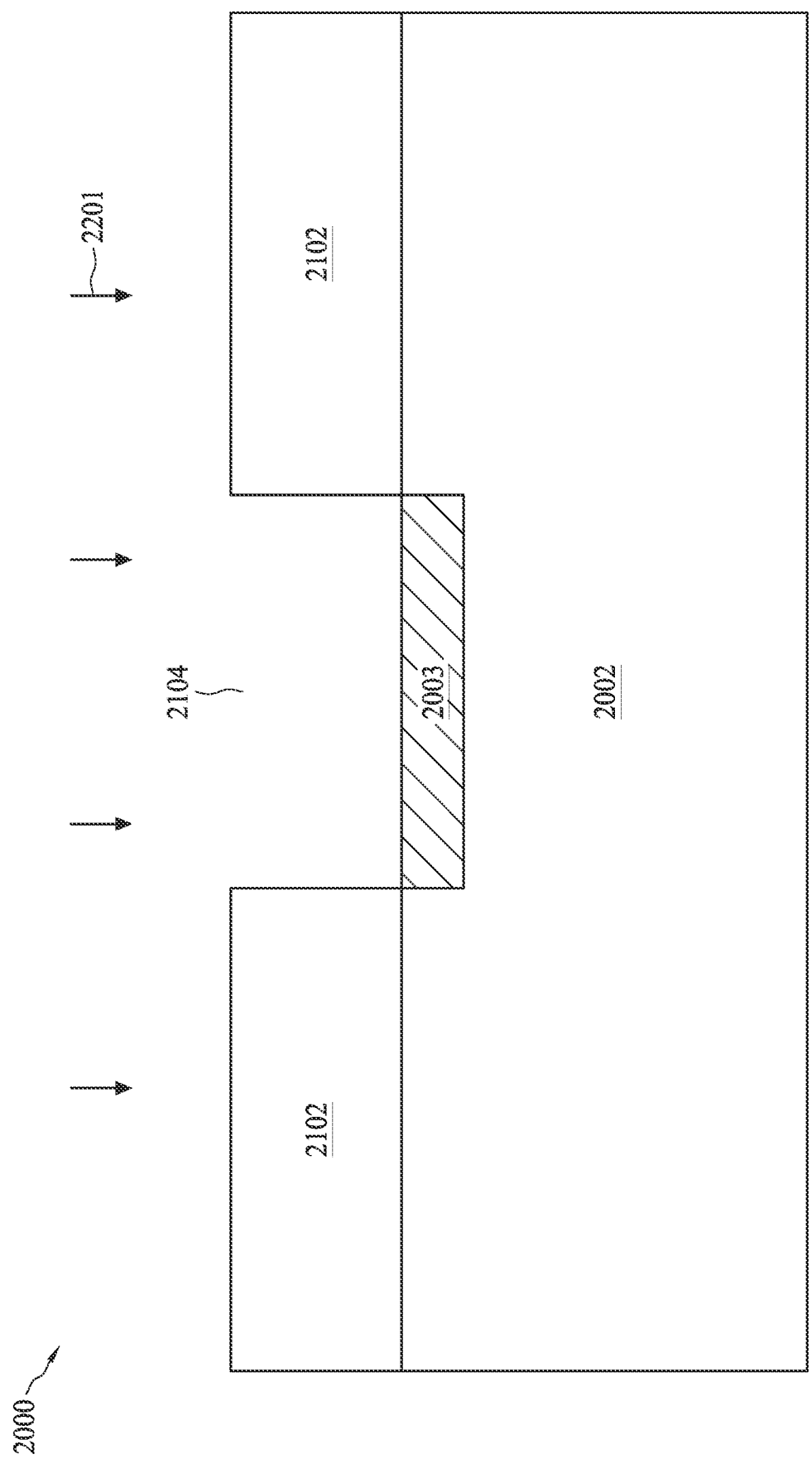

Corresponding to operation 1906 of FIG. 19, FIG. 22 is a cross-sectional view of the SOI device 2000 in which the first region 2003 of the silicon substrate 2002 is doped, in accordance with various embodiments. The cross-sectional view of FIG. 22 is cut along the lengthwise direction of a channel of the SOI device 2000 (e.g., similar to the cross-sectional view shown in FIG. 1).

In some embodiments, an (e.g., ion) implanting process 2201 is used to dope the first region 2003 through the opening 2104. Further, the first region 2003 is doped with one or more n-type dopants such as, for example, phosphorus (P), arsenic (As), antimony (Sb). In the illustrated example of FIG. 22, the implanting process 2201 can be controlled with a certain (e.g., relatively low) energy level such that the "doped" region 2003 is present along the major surface of the silicon substrate 2002. As such, the doped region 2003 can present a first (e.g., relatively low) doping concentration. Alternatively stated, the doped region 2003 has a top surface level with the major (non-etched) surface of the silicon substrate 2002, i.e., a depth defined as a difference between the top surface of the doped region 2003 and the major surface of the silicon substrate 2002 that is being about zero. As will be discussed below, by controlling the respective energy levels, different doped portions in respectively different regions (e.g., different depths) within the silicon substrate 2002 can be formed.

Figure 23:
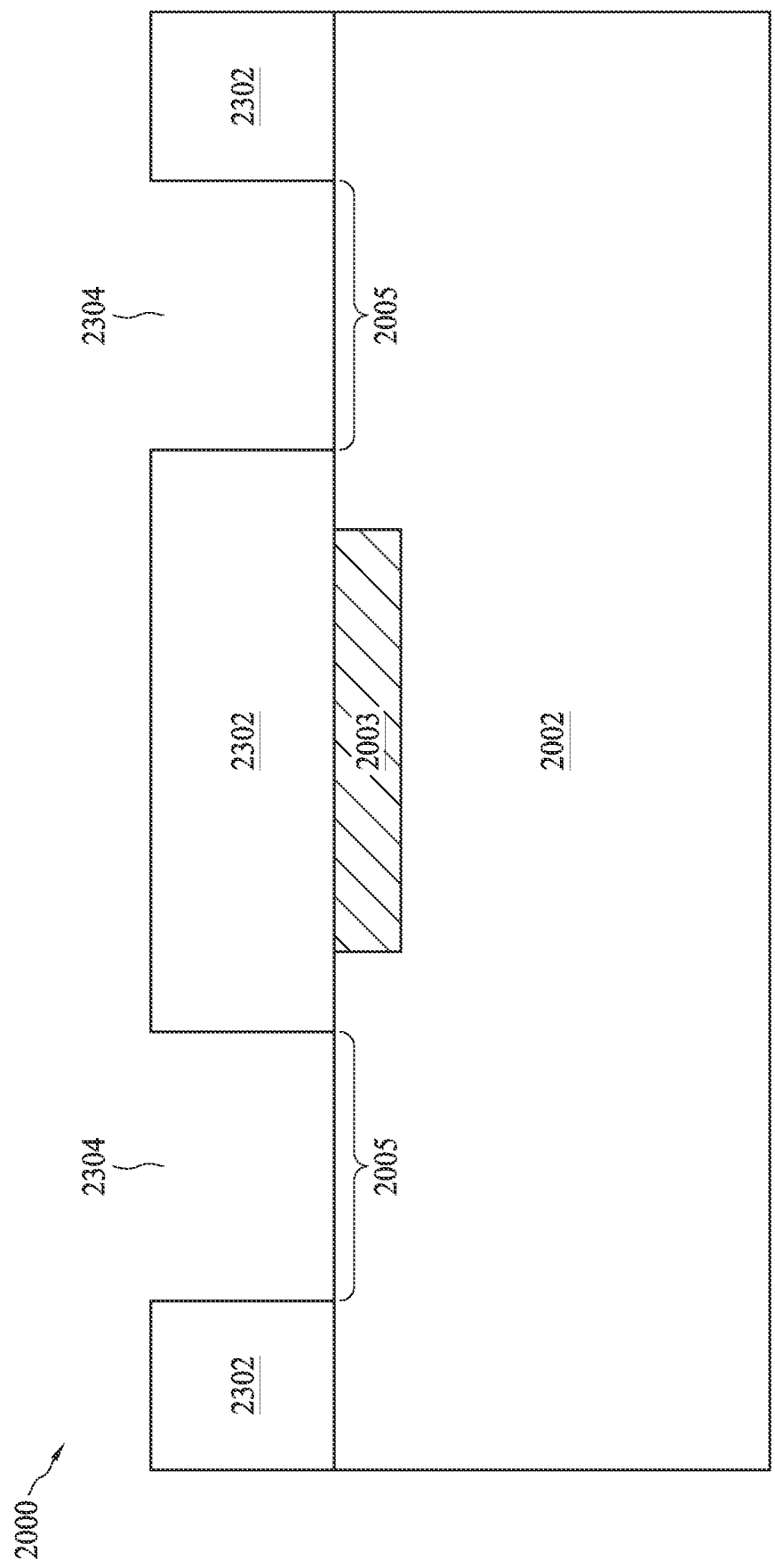

Corresponding to operation 1908 of FIG. 19, FIG. 23 is a cross-sectional view of the SOI device 2000 in which the silicon substrate 2002 is overlaid by a second patterned layer 2302, in accordance with various embodiments. The cross-sectional view of FIG. 23 is cut along the lengthwise direction of a channel of the SOI device 2000 (e.g., similar to the cross-sectional view shown in FIG. 1).

As shown, the second patterned layer 2302 overlays the major surface of the silicon substrate 2002 with a different opening 2304 exposing a second region 2005 of the silicon substrate 2002. As will be discussed below, such a second region may define the footprint of a corresponding BOX formed in the silicon substrate 2002. In some embodiments, the second patterned layer 2302 includes silicon nitride deposited using, for example, low-pressure chemical vapor deposition (LPCVD). In alternative embodiments, the second patterned layer 2302 is formed by thermal nitridation of silicon, chemical vapor deposition (CVD) such as plasma enhanced CVD (PECVD), low pressure CVD (LPCVD), or plasma anodic nitridation using nitrogen-hydrogen. In different embodiments, the second patterned layer 2302 includes silicon nitride, silicon oxy-nitride, titanium nitride, silicon containing ARC layer, amorphous carbon layer and/or a silicon-containing low-k layer. After the deposition (e.g., as a blanket layer), the second patterned layer 2302 is then "patterned" using an anisotropic etching process thereby exposing the second region 2005. Although the second patterned layer 2302 is shown as a single layer in the illustrated example of FIG. 23, the second patterned layer 2302 may comprise multiple layers. For example, other than the silicon nitride layer, the second patterned layer 2302 may include a pad layer (formed of silicon oxide) beneath the silicon nitride layer and a tetraethoxysilane (TEOS) layer above the silicon nitride layer.

Figure 24:
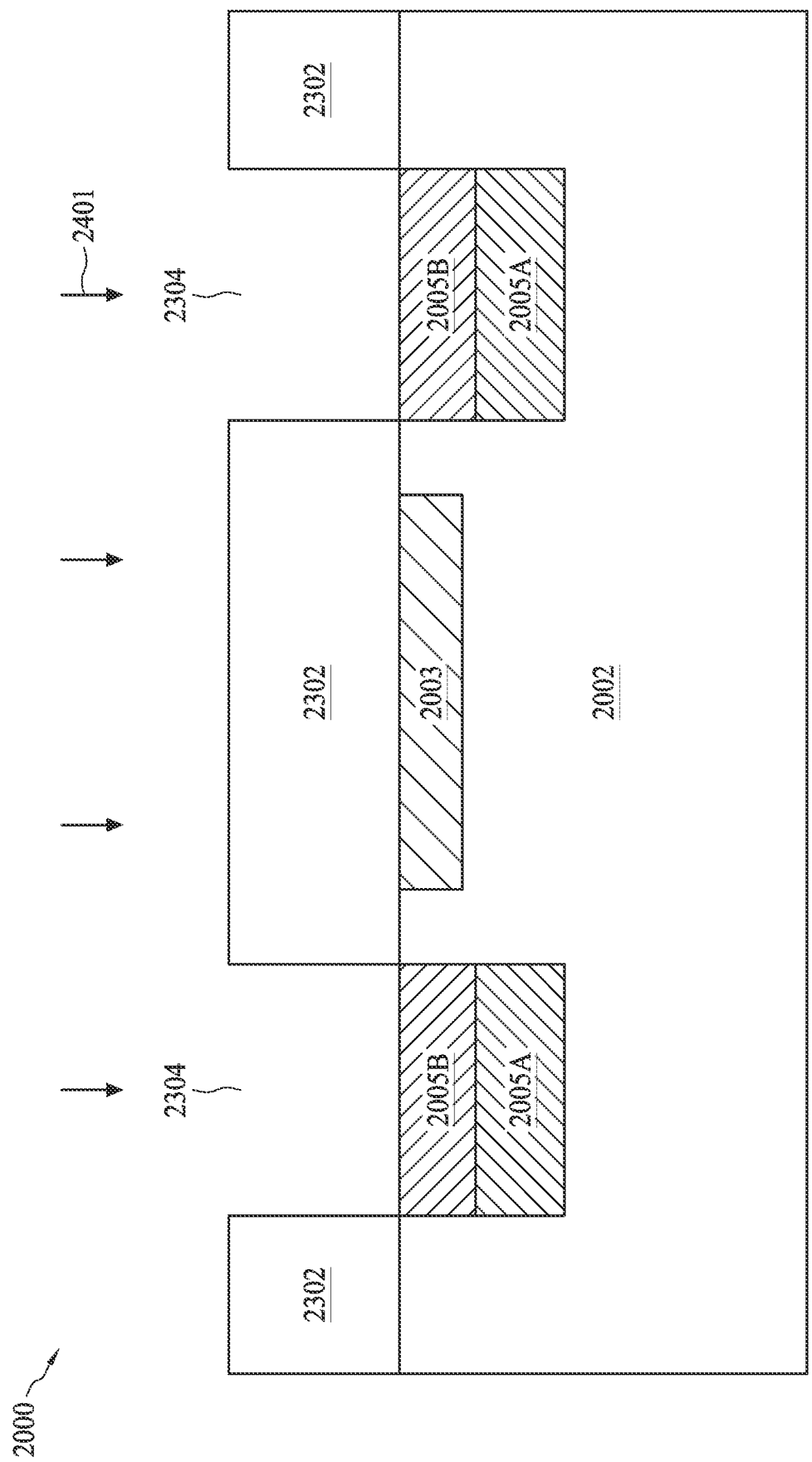

Corresponding to operation 1910 of FIG. 19, FIG. 24 is a cross-sectional view of the SOI device 2000 in which the second region 2005 of the silicon substrate 2002 is doped, in accordance with various embodiments. The cross-sectional view of FIG. 24 is cut along the lengthwise direction of a channel of the SOI device 2000 (e.g., similar to the cross-sectional view shown in FIG. 1).

In some embodiments, at least an (e.g., ion) implanting process 2401 is used to dope the second region 2005 through the opening 2304. Further, the second region 2005 is doped with one or more n-type dopants such as, for example, phosphorus (P), arsenic (As), antimony (Sb). In the illustrated example of FIG. 24, in contrast with the implanting process 2201 (FIG. 22), the implanting process 2401 can be controlled with a certain (e.g., relatively high) energy level such that the "doped" region 2005A, is present away from the major surface of the silicon substrate 2002 with a vertical distance. As such, the doped region 2005A can present a second (e.g., relatively high) doping concentration. Alternatively stated, the doped region 2005A has a top surface vertically spaced from the major (non-etched) surface of the silicon substrate 2002, i.e., a depth defined as a difference between the top surface of the doped region 2005A and the major surface of the silicon substrate 2002 that is being non-zero. Alternatively or additionally, the implanting process 2401 may be optionally followed with another implanting process (not shown) to also dope the second region 2005 through the opening 2304, but with one or more p-type dopants. Using such an opposite conductive type of dopants in the same region (e.g., 2005), a profile of the n-type doped region 2005A can be better defined by p-type doped region 2005B, as shown.

Figure 25:
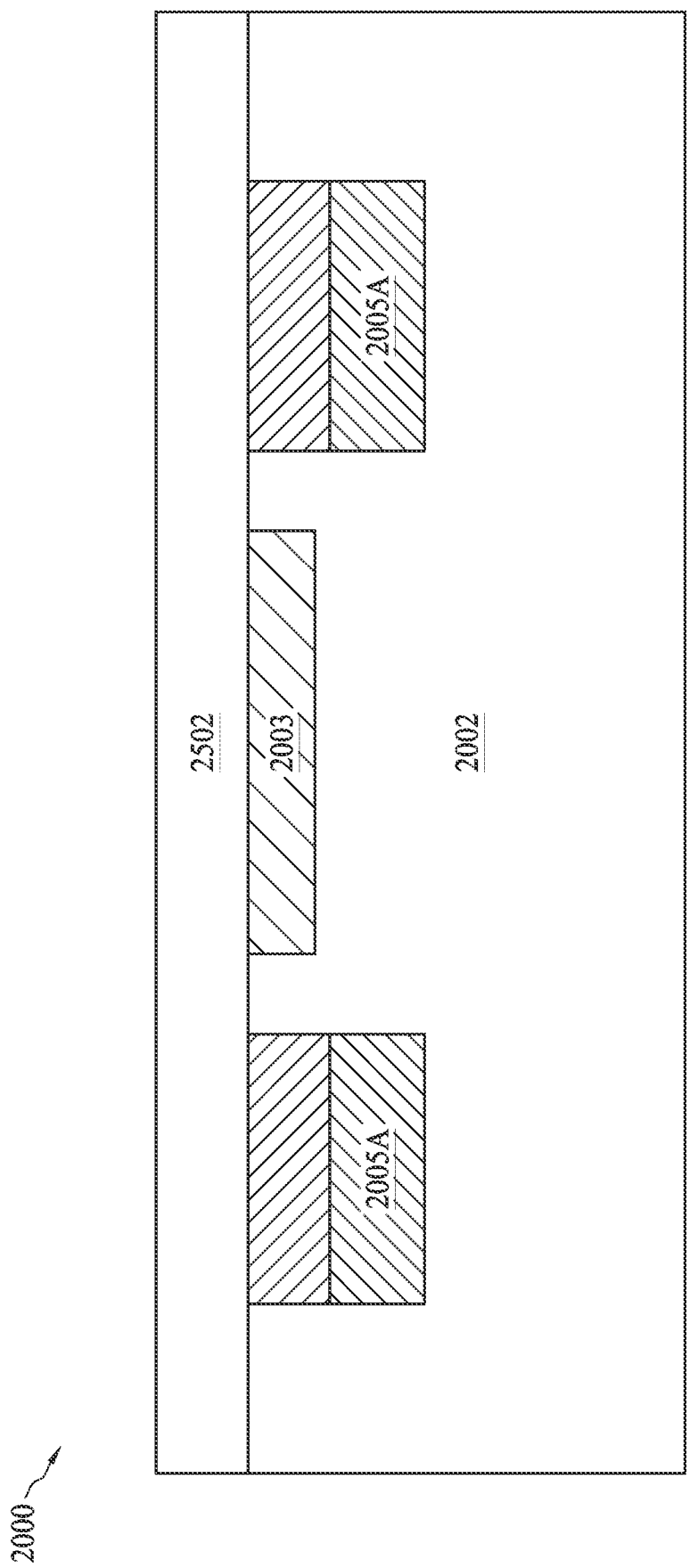

Corresponding to operation 1912 of FIG. 19, FIG. 25 is a cross-sectional view of the SOI device 2000 with a (e.g., upper) silicon layer 2502, in accordance with various embodiments. The cross-sectional view of FIG. 25 is cut along the lengthwise direction of a channel of the SOI device 2000 (e.g., similar to the cross-sectional view shown in FIG. 1).

Upon forming the doped regions 2003 and 2005A, the second patterned layer 2302 (FIG. 24) is removed. Next, the upper silicon layer 2502 is formed over the silicon substrate 2002 and the doped regions 2003 and 2005A (and 2005B if present). In various embodiments, the upper silicon layer 2502 can be epitaxially grown from the silicon substrate 2002. For example, the upper silicon layer 2502 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the silicon substrate 2002 extends upwardly, resulting in the upper silicon layer 2502 having the same crystal orientation with the silicon substrate 2002. In various embodiments, the upper silicon layer 2502 is configured to form a channel, a pair of source/drain structures of the SOI device 2000, which will be discussed below. Depending on a desired conductive type of the SOI device 2000, the upper silicon layer 2502 may be doped with p-type dopants (e.g., boron (B), aluminum (Al), indium (In), gallium (Ga), etc.) or n-type dopants (e.g., phosphorus (P), arsenic (As), antimony (Sb), etc.).

Figure 26:
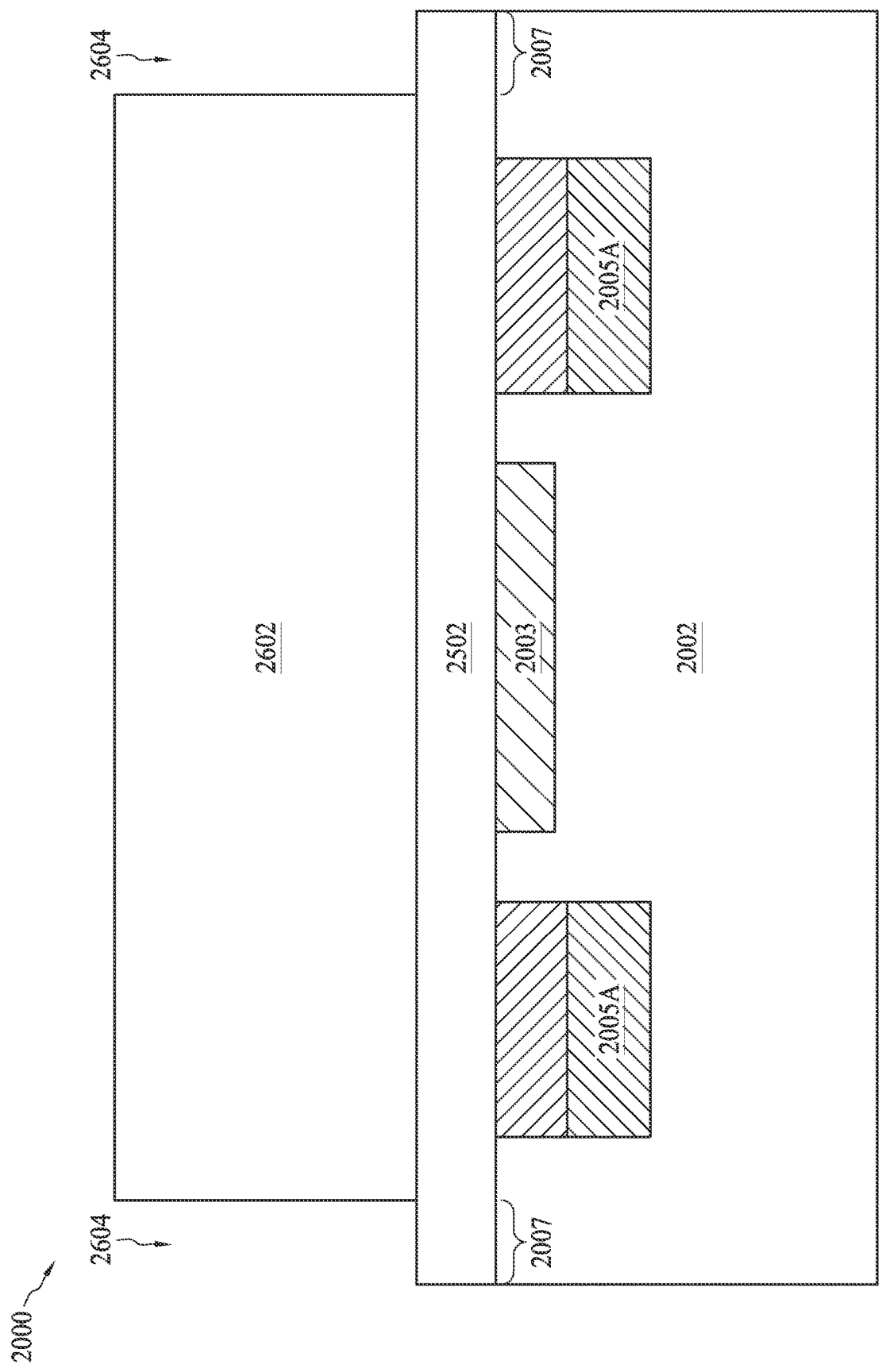

Corresponding to operation 1914 of FIG. 19, FIG. 26 is a cross-sectional view of the SOI device 2000 in which the upper silicon layer 2502 is overlaid by a third patterned layer 2602, in accordance with various embodiments. The cross-sectional view of FIG. 26 is cut along the lengthwise direction of a channel of the SOI device 2000 (e.g., similar to the cross-sectional view shown in FIG. 1).

As shown, the third patterned layer 2602 overlays a major surface of the upper silicon layer 2502, and has an opening 2604 defining a third region 2007 of the silicon substrate 2002 (with the upper silicon layer 2502 disposed thereupon). As will be discussed below, such a third region may define the footprint of a corresponding STI formed in the silicon substrate 2002. In some embodiments, the third patterned layer 2602 includes silicon nitride deposited using, for example, low-pressure chemical vapor deposition (LPCVD). In alternative embodiments, the third patterned layer 2602 is formed by thermal nitridation of silicon, chemical vapor deposition (CVD) such as plasma enhanced CVD (PECVD), low pressure CVD (LPCVD), or plasma anodic nitridation using nitrogen-hydrogen. In different embodiments, the third patterned layer 2602 includes silicon nitride, silicon oxy-nitride, titanium nitride, silicon containing ARC layer, amorphous carbon layer and/or a silicon-containing low-k layer. After the deposition (e.g., as a blanket layer), the third patterned layer 2602 is then "patterned" using an anisotropic etching process thereby defining the third region 2007. Although the third patterned layer 2602 is shown as a single layer in the illustrated example of FIG. 26, the third patterned layer 2602 may comprise multiple layers. For example, other than the silicon nitride layer, the third patterned layer 2602 may include a pad layer (formed of silicon oxide) beneath the silicon nitride layer and a tetraethoxysilane (TEOS) layer above the silicon nitride layer.

Figure 27:
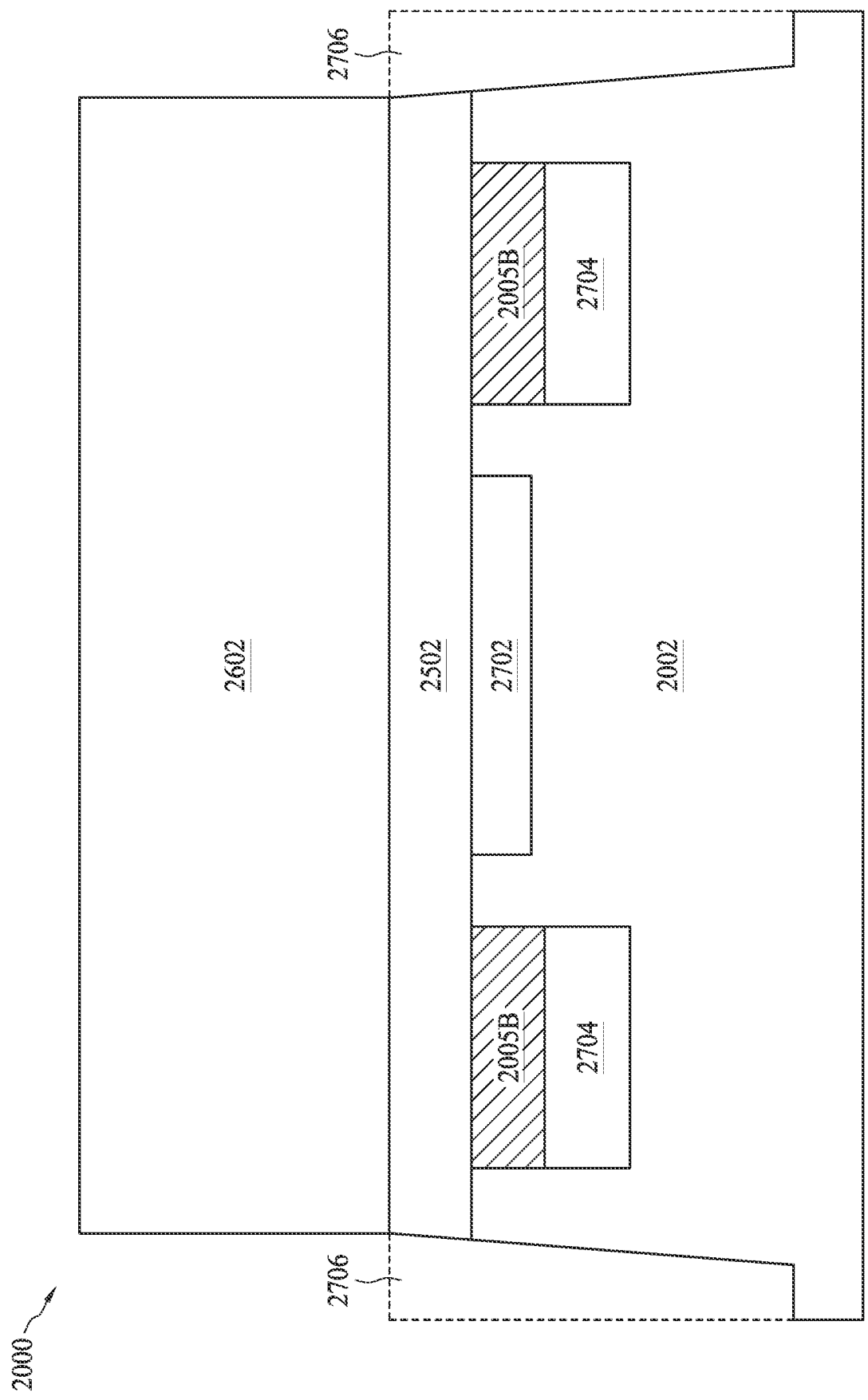

Corresponding to operation 1916 of FIG. 19, FIG. 27 is a cross-sectional view of the SOI device 2000 in which the doped (first) region 2003, the doped (second) region 2005A, and the (third) region 2007, shown in FIG. 26, are removed, in accordance with various embodiments. The cross-sectional view of FIG. 27 is cut along the lengthwise direction of a channel of the SOI device 2000 (e.g., similar to the cross-sectional view shown in FIG. 1).

As shown, the n-type doped regions 2003 and 2005A, and the third region 2007 (together with the portion of the upper silicon layer 2502 overlaying the third region 2007) are removed to form recesses 2702, 2704, and 2706 in the silicon substrate 2002, respectively. Although not shown in the cross-sectional view of FIG. 27, it should be appreciated that the recess 2706, upon being formed, can expose at least one of the sidewalls of each of the recesses 2702 and 2704. For example, the recess 2706 may be formed as a trench surrounding a region of the silicon substrate 2002, and the recesses 2702 and 2704 each have at least one sidewall or otherwise side connected to such a trench.

In various embodiments, using the third patterned layer 2602 as a mask, the recesses 2702 to 2706 may be formed through a series of etching processes. For example, a first etching process may remove the overlaying portion of the upper silicon layer 2502 and at least some upper portion of the silicon substrate 2002 in the third region 2007. As a result, at least some portion of the sidewall(s) of the n-type doped regions 2003 and 2005A can be exposed. Next, a second etching process may selectively remove the n-type doped regions 2003 and 2005A, forming the recesses 2702 and 2704, respectively. In various embodiments, the second etching process may laterally etch the doped regions 2003 and 2005A through their exposed sidewall(s). Following the second etching process, a third etching process (similar to the first etching process) may further etch the second region 2007, forming the recess 2706.

As a non-limiting example, the first (and third) etching processes may be configured to have at least some anisotropic etching characteristic. For example, the first (and third) etching processes can include a plasma etching process with a non-zero RF bias power, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, the gas sources and/or the passivation gases can be diluted with gases such as argon (Ar), helium (He), neon (Ne), and other suitable dilutive gases and combinations thereof.

On the other hand, the second etching process may be configured to have at least some isotropic etching characteristic to selectively etch the n-doped regions 2003 and 2005A. Alternatively stated, the region of silicon substrate 2003 and 2005A doped in n-type can present a higher etching rate than other portions of the silicon substrate which are intrinsic or doped in p-type (e.g. 2005B). Further, the higher the concentration of n-type dopants is, the higher the etching rate is, in some embodiments. For example, the second etching process can include a plasma etching process with a zero RF bias power, which can have a certain amount of isotropic characteristic. In such a plasma etching process (including radical plasma etching, remote plasma etching, and other suitable plasma etching processes), gas sources such as chlorine ($Cl_2$), boron trichloride ($BCl_3$), carbon tetrachloride ($CCl_4$), silicon tetrachloride ($SiCl_4$), and other suitable chlorine-based gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, the gas sources and/or the passivation gases can be diluted with gases such as argon (Ar), helium (He), neon (Ne), and other suitable dilutive gases and combinations thereof.

Figure 28:
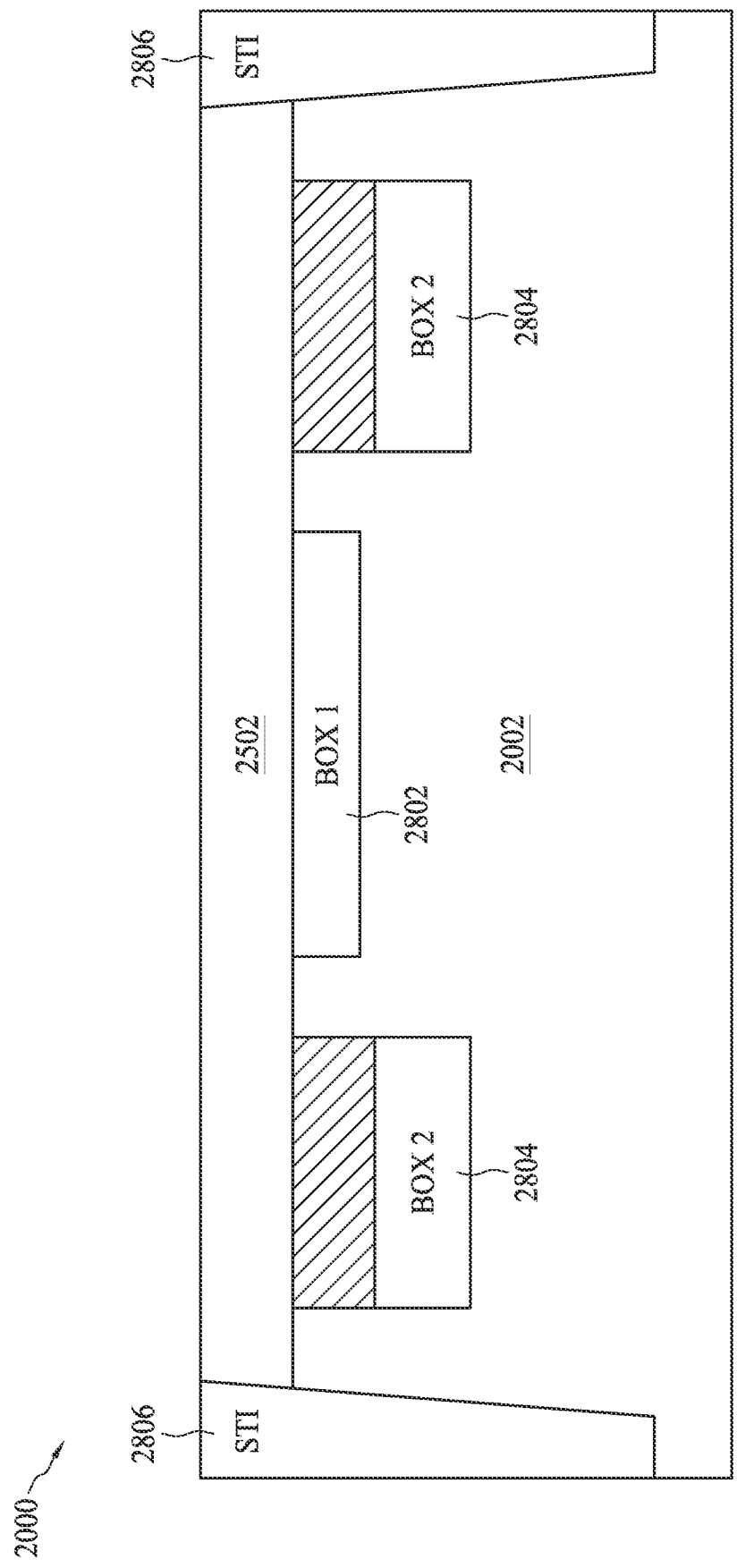

Corresponding to operation 1918 of FIG. 19, FIG. 28 is a cross-sectional view of the SOI device 2000 including a first BOX 2802, a second BOX 2804, and an STI 2806 connected to each of the BOX'es, in accordance with various embodiments. The cross-sectional view of FIG. 28 is cut along the lengthwise direction of a channel of the SOI device 2000 (e.g., similar to the cross-sectional view shown in FIG. 1).

Upon forming the recesses 2702 to 2706, a dielectric material is deposited or otherwise formed to fill them. Next, a chemical mechanical polish (CMP) is then performed to planarize the major surface of the upper silicon layer 2502 to concurrently form the BOX'es 2802-2804 and STI 2806. As such, the BOX'es 2802-2804 and STI 2806 can inherit the dimensions and profiles of the recesses 2702 to 2706, respectively. For example, the BOX'es 2802-2804 each have at least one of its sidewalls connected to the STI 2806. For another example, the BOX 2802 has a top surface in contact with a bottom surface of the upper silicon layer 2502, and the BOX 2804 has a top surface spaced apart from the bottom surface of the upper silicon layer 2502. In one embodiment, the dielectric material, filling the recesses 2702 to 2706, includes silicon oxide, for example, formed by sub-atmospheric chemical vapor deposition (SA-CVD). In other embodiments, the dielectric material is formed by high-density plasma chemical vapor deposition (HDP-CVD) or spin on glass (SOG). Such a recess fill can be a single material or multiple materials.

Figure 29:
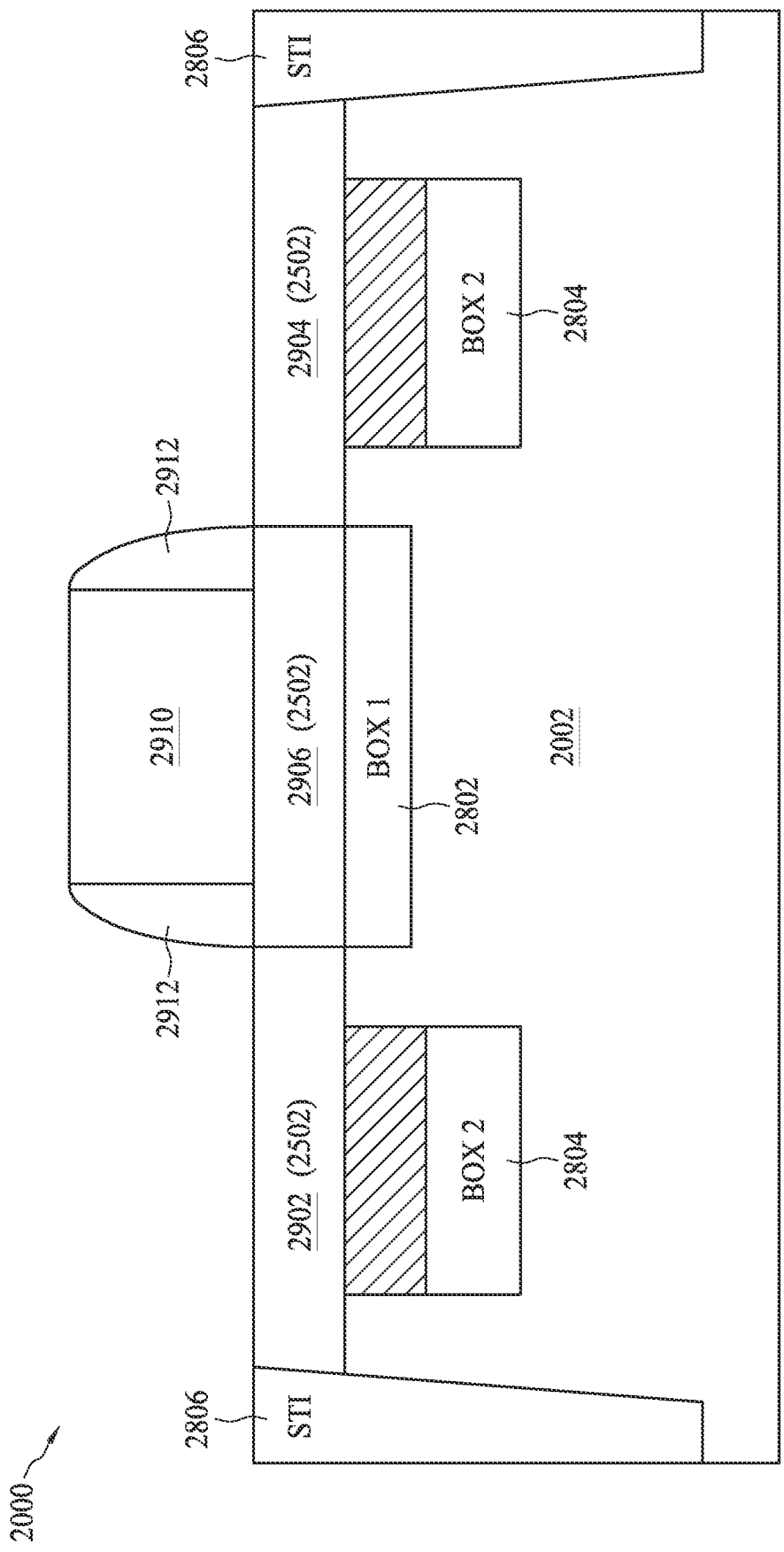

Corresponding to operation 1920 of FIG. 19, FIG. 29 is a cross-sectional view of the SOI device 2000 including a first source/drain structure (or region) 2902, a second source/drain structure (or region) 2904, a channel 2906, a gate structure 2910, and a gate spacer 2912, in accordance with various embodiments. The cross-sectional view of FIG. 29 is cut along the lengthwise direction of a channel of the SOI device 2000 (e.g., similar to the cross-sectional view shown in FIG. 1).

In some embodiments, the source/drain regions 2902-2904 and the channel 2906 are formed in the upper silicon layer 2502. The source/drain regions 2902-2904 may comprise highly doped regions of a first conductivity type, whereas the channel 2906 may comprise an opposite second conductivity type. The gate structure 2910, or sometimes referred to as a gate stack, may include a gate electrode layer formed over a gate dielectric layer, which are not shown separately for the sake of clarity. The gate dielectric layer may be formed of high-k dielectric materials. The gate electrode layer may include metals, metal silicides, polysilicon, metal nitrides, and the like. Such a gate stack may be formed using a gate-first approach or a gate-last approach.

In a gate-first approach, a gate electrode layer is deposited on a gate dielectric layer, both of which are formed as blanket layers. Next, the (blanket) gate dielectric layer and the (blanket) gate electrode layer are patterned to form the gate stack 2910. Next, the gate spacer 2912 is formed on opposite sides of the gate stack 2910. Source/drain regions, 2902 and 2904, are then formed by implanting the exposed upper silicon layer 2502, followed by an activation annealing. A silicide region (not shown) is formed on the source/drain regions 2902 and 2904. A contact etch stop layer is deposited followed by an inter-layer dielectric, and contact plugs (also not shown).

In a gate-last approach, a dummy gate is deposited on the upper silicon layer 2502 or a blanket gate dielectric layer, followed by patterning process to form a dummy gate stack. In one embodiment, the dummy gate, comprising a layer of TiN or TaN, is deposited followed by a layer of polysilicon. Next, the gate spacer 2912 is formed on opposite sides of the dummy gate stack. Source/drain regions, 2902 and 2904, are then formed by implanting the exposed upper silicon layer 2502, followed by an activation annealing. Source/drain silicides are then formed, followed by the formation of contact etch stop layer, and inter-layer dielectric. The inter-layer dielectric is polished to expose the dummy gate stack, and at least a portion of the dummy gate stack is etched and removed. The etched out portion of the dummy gate stack is replaced by the gate stack 2910. Contact plugs are then formed.

Figure 30:
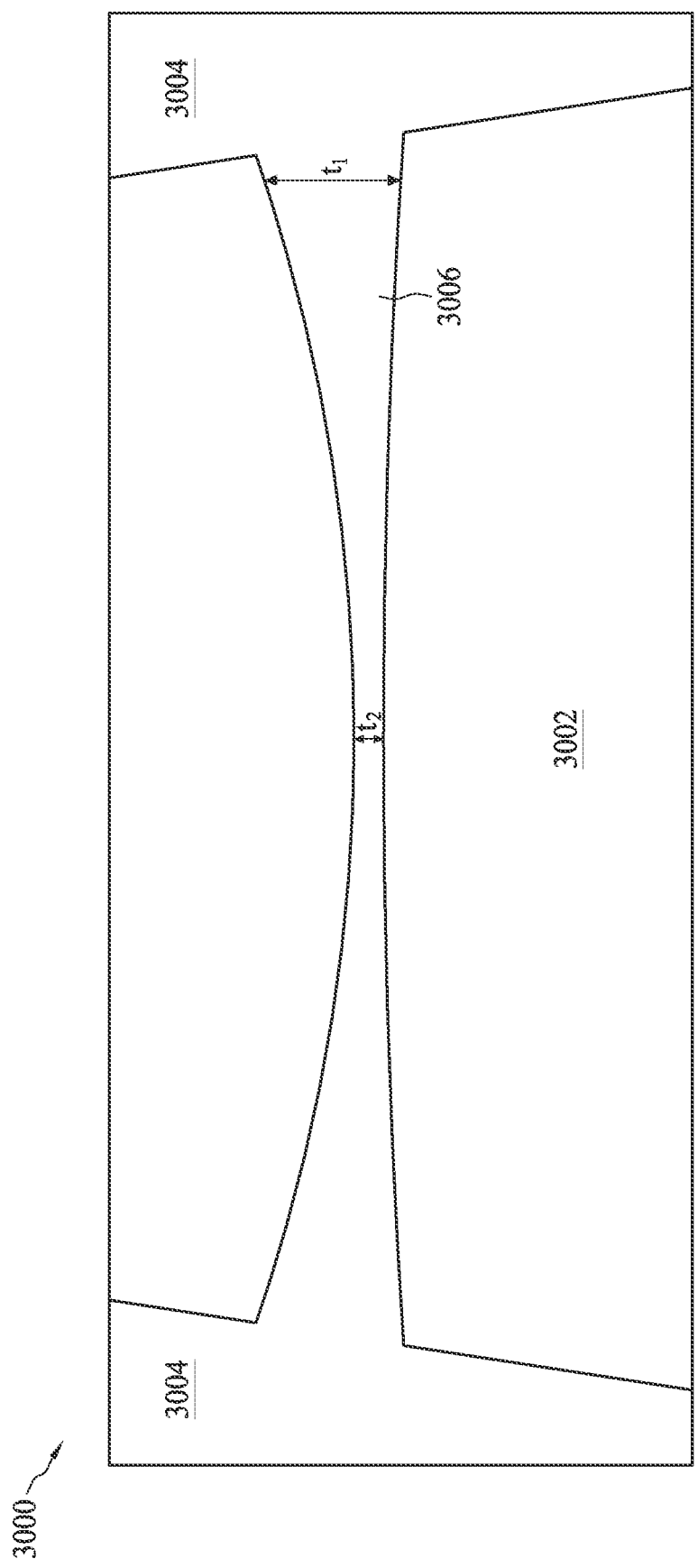
FIGS. 30 and 31 each illustrate a cross-sectional view of a portion of yet another example semiconductor device (e.g., an SOI device), made by the method of FIG. 10 or 19, in accordance with some embodiments.
Figure 31:
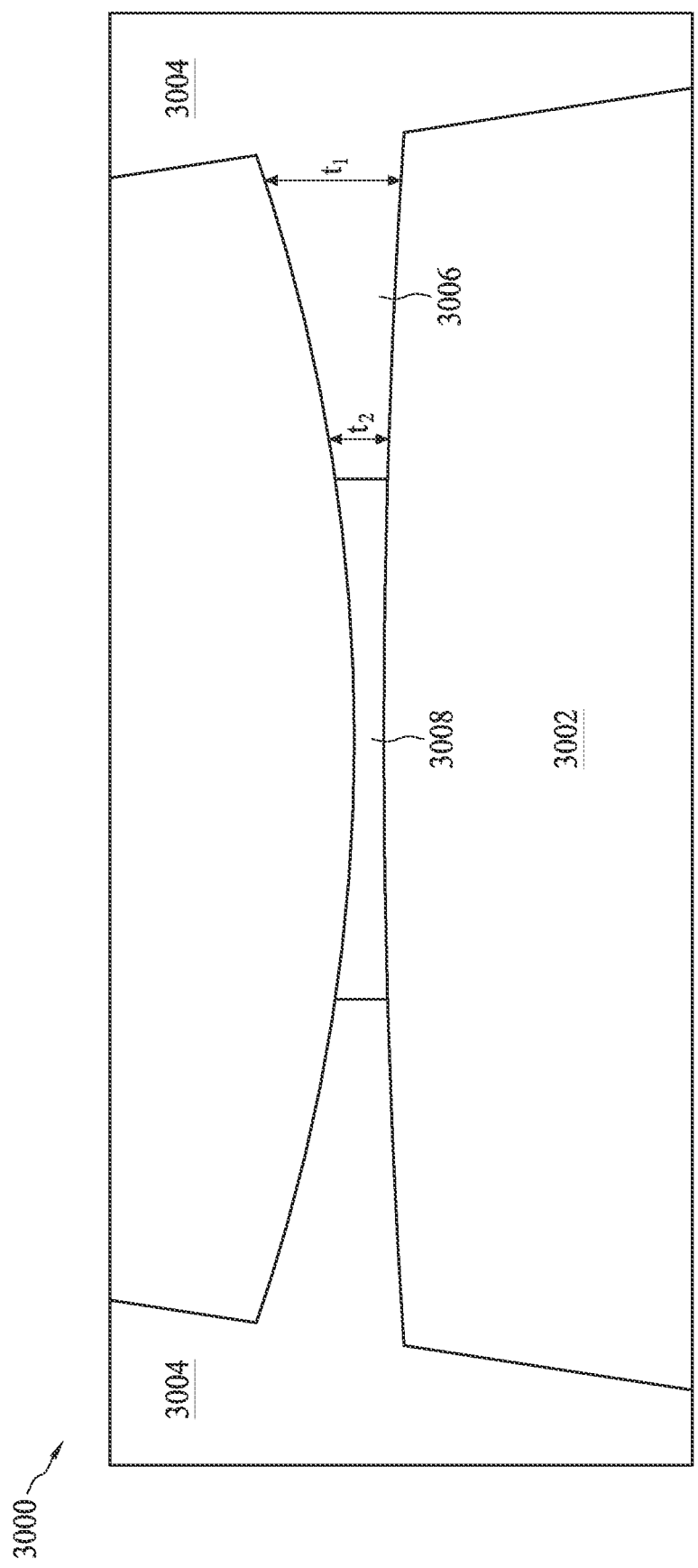

FIGS. 30 and 31 each illustrate a cross-sectional view of a portion of an SOI device 3000, made by any of the disclosed methods (e.g., 1000, 1900), in accordance with various embodiments. As shown, the SOI device 300 has an STI 3004 (e.g., similar to 1704, 2806) and a BOX 3006 (e.g., similar to 1702, 2802, 2804) formed in a silicon substrate 3002, with other device features (e.g., a channel, source/drain structures, a gate structure) not shown for the sake of clarity. In each of these cross-sectional views of FIGS. 30-31, the BOX 3006 is shown as being connected to the STI 3004. In particular, the BOX 3006, shown in FIG. 30, has a varying thickness changes from "t1" in the portion closer to the STI 3004 to "t2" in the portion farther away from the STI 3004. The BOX 3006, shown in FIG. 31, also has a varying thickness changes from "t1" in the portion closer to the STI 3004 to "t2" in the portion farther away from the STI 3004. Further, the BOX 3006 can (e.g., laterally) enclose an air gap 3008, which may be formed as a result of partially filling a removed doped region (e.g., similar to 1602, 2702, 2704).

In one aspect of the present disclosure, a semiconductor device is disclosed. The semiconductor device includes a first silicon layer. The semiconductor device includes a plurality of first buried oxide layers embedded in the first silicon layer. The semiconductor device includes a second silicon layer disposed over the plurality of first buried oxide layers. Vertical distances between the plurality of first buried oxide layers and the second silicon layer, respectively, are different.

In another aspect of the present disclosure, a semiconductor device is disclosed. The semiconductor device includes a transistor comprising a gate structure, a first source/drain structure, and a second source/drain structure. The gate structure is laterally disposed between the first source/drain structure and the second source/drain structure. The first source/drain structure and the second source/drain structure are formed in a first silicon layer disposed over a second silicon layer, the first silicon layer having at least a portion in direct contact with the second silicon layer. The second silicon layer includes a plurality of buried oxide layers.

In yet another aspect of the present disclosure, a method for fabricating semiconductor devices is disclosed. The method includes doping a first region of a first silicon layer with first n-type dopants, wherein the first n-type dopants are in a first concentration. The method includes epitaxially growing a second silicon layer over the first silicon layer. The method includes selectively etching the first region of the first silicon layer. The method includes forming a first oxide layer in the first region.

As used herein, the terms "about" and "approximately" generally mean plus or minus 10% of the stated value. For example, about 0.5 would include 0.45 to 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first silicon layer;
    a plurality of first buried oxide layers embedded in the first silicon layer; and
    a second silicon layer disposed over the plurality of first buried oxide layers;
    wherein vertical distances between the plurality of first buried oxide layers and the second silicon layer, respectively, are different, wherein all of the plurality of first buried oxide layers are separated from one another, and wherein all of the plurality of first buried oxide layers are laterally offset from one another and vertically spaced apart from one another.

2. The semiconductor device of claim 1, further comprising a shallow trench isolation structure surrounding the first silicon layer, wherein each of the plurality of first buried oxide layers has at least one sidewall in contact with the shallow trench isolation structure.

3. The semiconductor device of claim 1, further comprising:
    a first source/drain structure in the second silicon layer; and
    a second source/drain structure in the second silicon layer.

4. The semiconductor device of claim 3, wherein a topmost one of the plurality of first buried oxide layers is in contact with at least one of the first source/drain structure or second source/drain structure.

5. The semiconductor device of claim 3, further comprising a gate structure disposed over the second silicon layer and between the first source/drain structure and second source/drain structure.

6. The semiconductor device of claim 5, wherein a region of the second silicon layer, disposed below the gate structure, is free from being connected to any of the plurality of first buried oxide layers.

7. The semiconductor device of claim 5, wherein a region of the second silicon layer, disposed below the gate structure, is partially or fully connected to a topmost one of the plurality of first buried oxide layers.

8. The semiconductor device of claim 1, wherein the second silicon layer is an epitaxial layer.

9. The semiconductor device of claim 1, further comprising at least one second buried oxide layer embedded in the second silicon layer.

10. A semiconductor device, comprising:
a first silicon layer;
a plurality of buried oxide layers embedded in the first silicon layer;
a second silicon layer disposed over the plurality of buried oxide layers; and
a first and a second source/drain structures disposed in the second silicon layer,
wherein a topmost one of the plurality of buried oxide layers is in contact with at least one of the first and the second source/drain structures, and wherein all of the plurality of buried oxide layers are laterally offset from one another and vertically spaced apart from one another.

11. The semiconductor device of claim 10, further comprising:
a gate structure disposed over the second silicon layer and between the first source/drain structure and second source/drain structure.

12. The semiconductor device of claim 10, wherein vertical distances between the plurality of buried oxide layers and the second silicon layer, respectively, are different.

13. The semiconductor device of claim 10, wherein the second silicon layer includes an epitaxial layer.

14. The semiconductor device of claim 10, wherein a region of the second silicon layer is free from being connected to any of the plurality of buried oxide layers.

15. The semiconductor device of claim 10, further comprising:
a shallow trench isolation (STI) structure surrounding the first and the second silicon layers, wherein at least one of the plurality of buried oxide layers has at least one sidewall in contact with the STI structure.

16. A semiconductor device, comprising:
a first silicon layer;
a plurality of buried oxide layers embedded in the first silicon layer;
a second silicon layer disposed over the plurality of buried oxide layers; and
wherein a region of the second silicon layer is free from being connected to any of the plurality of buried oxide layers, wherein all of the plurality of buried oxide layers are separated from one another, and wherein all of the plurality of buried oxide layers are laterally offset from one another and vertically spaced apart from one another.

17. The semiconductor device of claim 16, wherein vertical distances between the plurality of buried oxide layers and the second silicon layer, respectively, are different.

18. The semiconductor device of claim 16, wherein the second silicon layer includes an epitaxial layer.

19. The semiconductor device of claim 16, further comprising:
a shallow trench isolation (STI) structure surrounding the first and the second silicon layers, wherein at least one of the plurality of buried oxide layers has at least one sidewall in contact with the STI structure.

20. The semiconductor device of claim 16, further comprising:
a gate structure disposed over the second silicon layer and between a first source/drain structure and a second source/drain structure.

* * * * *